(12) United States Patent
Saito et al.

(10) Patent No.: US 8,264,874 B2
(45) Date of Patent: Sep. 11, 2012

(54) SEMICONDUCTOR DEVICE

(75) Inventors: Toshihiko Saito, Kanagawa (JP); Takanori Matsuzaki, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1 day.

(21) Appl. No.: 12/890,856

(22) Filed: Sep. 27, 2010

(65) Prior Publication Data

US 2011/0080774 A1   Apr. 7, 2011

(30) Foreign Application Priority Data

Oct. 1, 2009   (JP) .................................. 2009-229869

(51) Int. Cl.
*G11C 11/00* (2006.01)

(52) U.S. Cl. ....................................... 365/163; 365/148

(58) Field of Classification Search .................. 365/163, 365/148

See application file for complete search history.

(56) References Cited

U.S. PATENT DOCUMENTS

| | | | |
|---|---|---|---|
| 6,051,851 A | 4/2000 | Ohmi et al. | |
| 7,714,408 B2 | 5/2010 | Tokunaga | |
| 7,745,827 B2 | 6/2010 | Asami | |
| 7,782,651 B2 | 8/2010 | Tokunaga et al. | |
| 2008/0089112 A1* | 4/2008 | Aratani et al. | 365/148 |
| 2008/0116500 A1 | 5/2008 | Tokunaga | |
| 2008/0205132 A1 | 8/2008 | Hirakata | |
| 2008/0211024 A1 | 9/2008 | Kato et al. | |
| 2008/0224140 A1 | 9/2008 | Tokunaga et al. | |
| 2008/0224229 A1 | 9/2008 | Tajima et al. | |
| 2009/0154262 A1 | 6/2009 | Tokunaga | |
| 2009/0195387 A1 | 8/2009 | Koyama et al. | |
| 2009/0303780 A1* | 12/2009 | Kasko et al. | 365/163 |
| 2009/0317968 A1 | 12/2009 | Nagata | |
| 2010/0193789 A1 | 8/2010 | Tokunaga | |
| 2010/0315868 A1* | 12/2010 | Tokunaga et al. | 365/163 |

FOREIGN PATENT DOCUMENTS

JP   3501416   3/2004

\* cited by examiner

*Primary Examiner* — Huan Hoang
(74) *Attorney, Agent, or Firm* — Nixon Peabody LLP; Jeffrey L. Costellia

(57) ABSTRACT

Objects of the present invention are to improve the manufacturing yield of semiconductor devices, reduce manufacturing cost of the semiconductor device, and reduce the circuit area of an integrated circuit included in the semiconductor device. A memory layer of a memory element and a resistive layer of a resistor included in the semiconductor device are formed of the same material. Therefore, the memory layer and the resistive layer are formed in the same step, whereby the number of manufacturing steps of the semiconductor device can be reduced. As a result, the manufacturing yield of the semiconductor devices can be improved and the manufacturing cost can be reduced. In addition, the semiconductor device includes a resistor having a resistive component which has high resistance value. Consequently, the area of the integrated circuit included in the semiconductor device can be reduced.

6 Claims, 20 Drawing Sheets

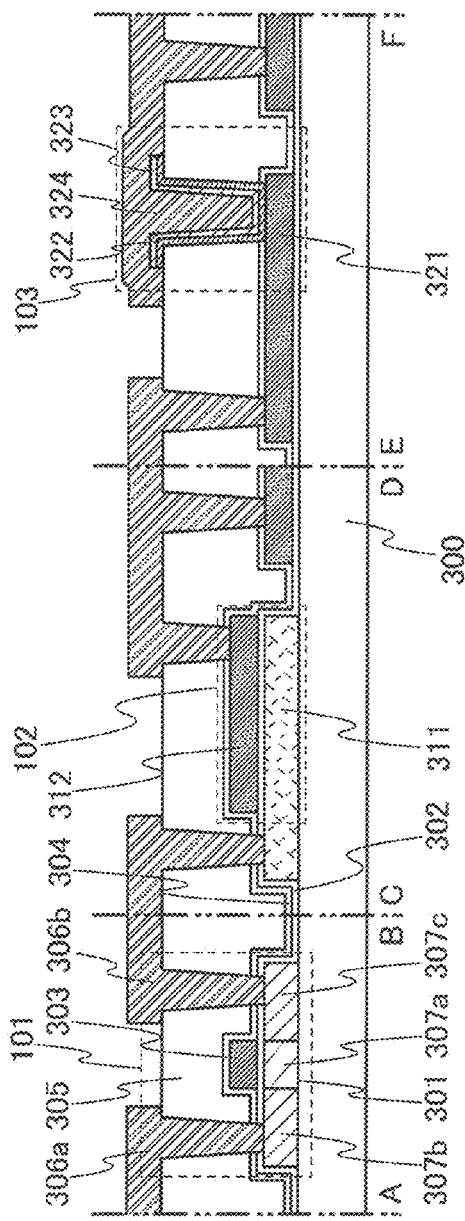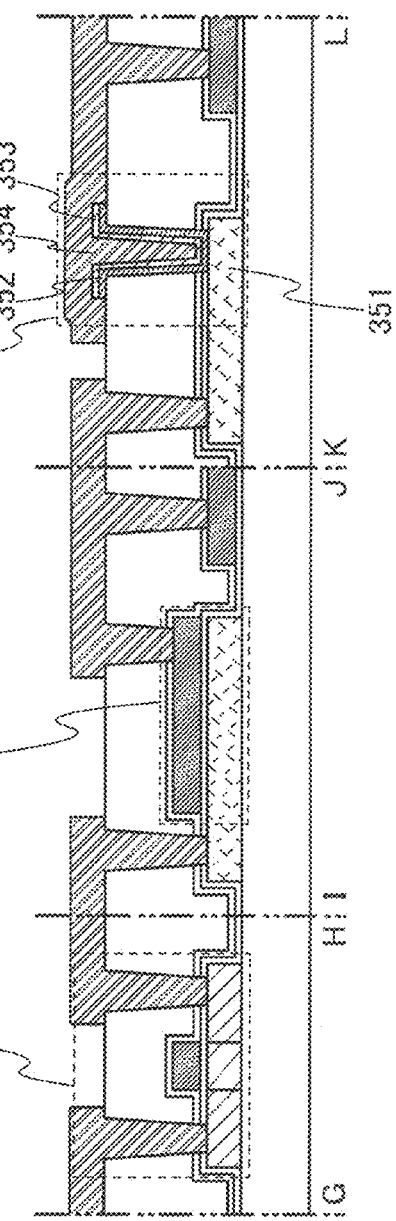

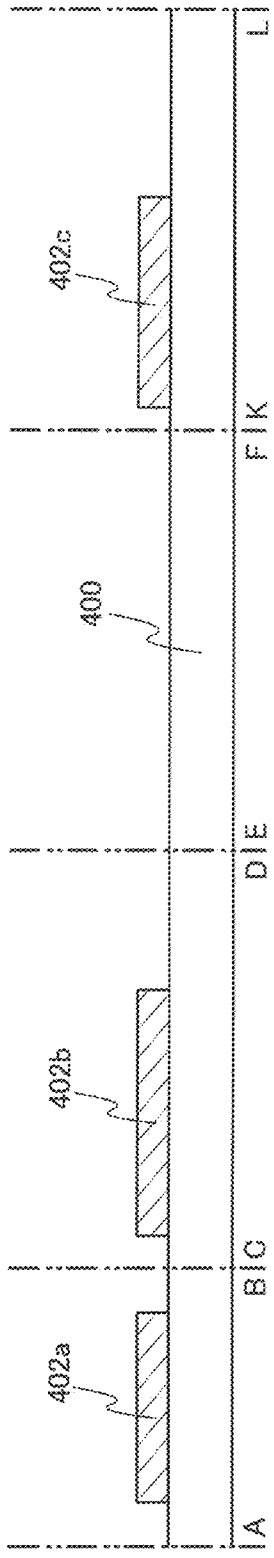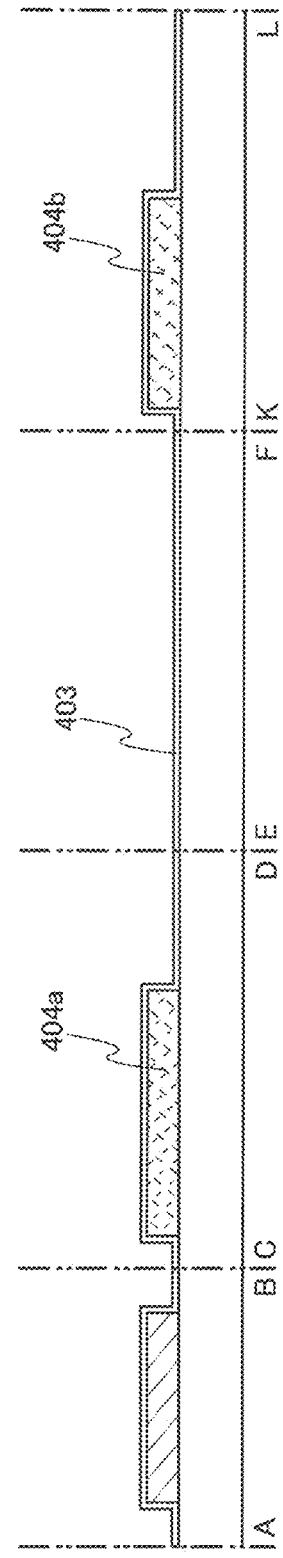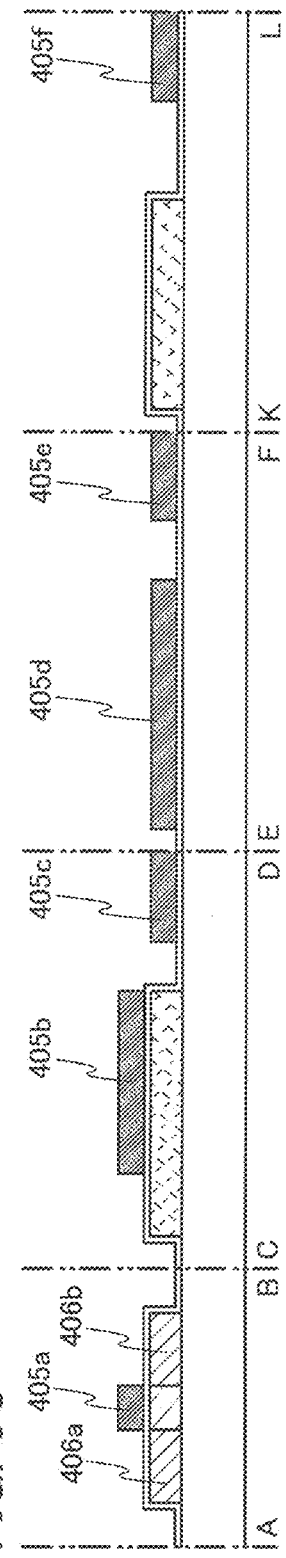

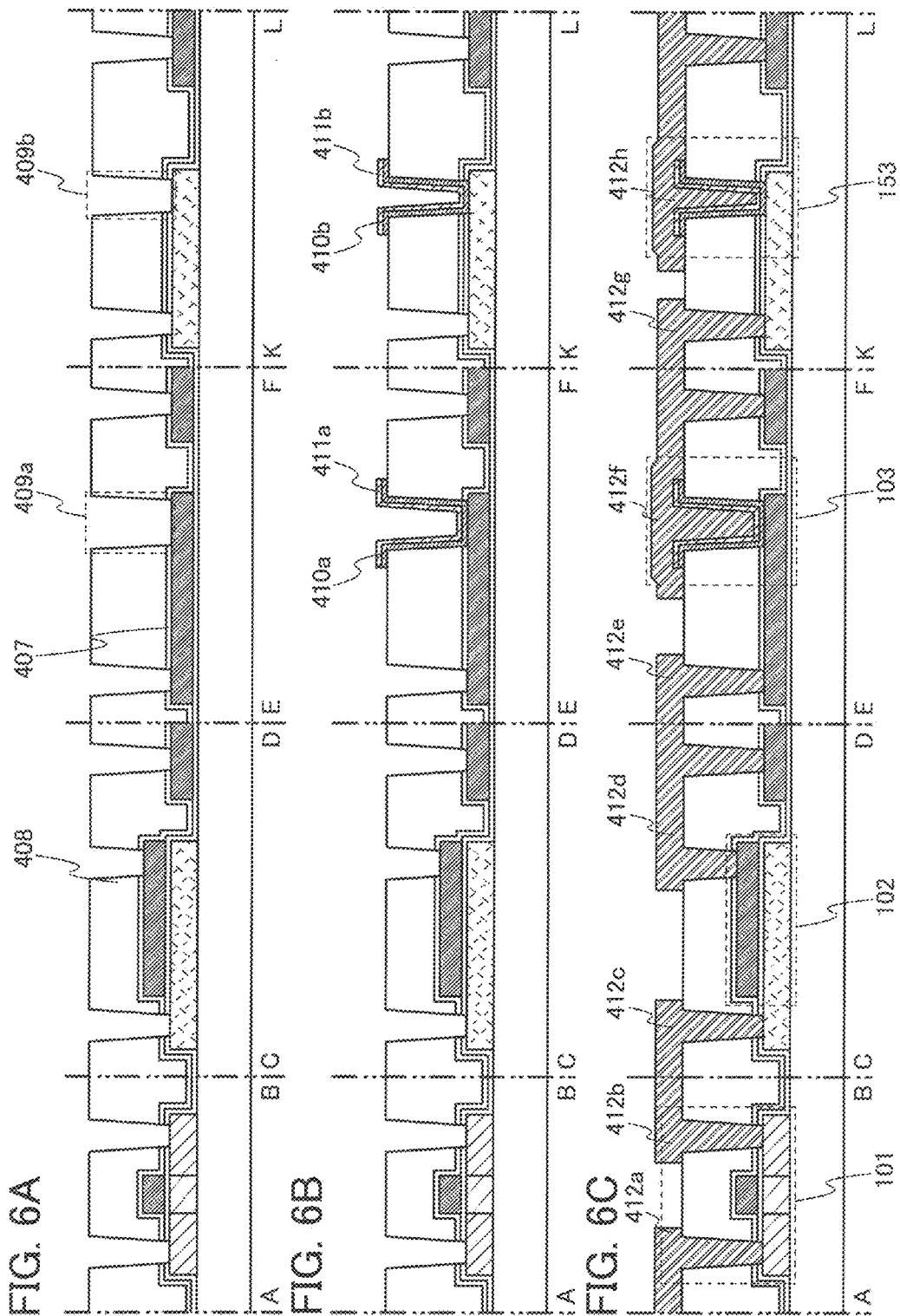

FIG. 8
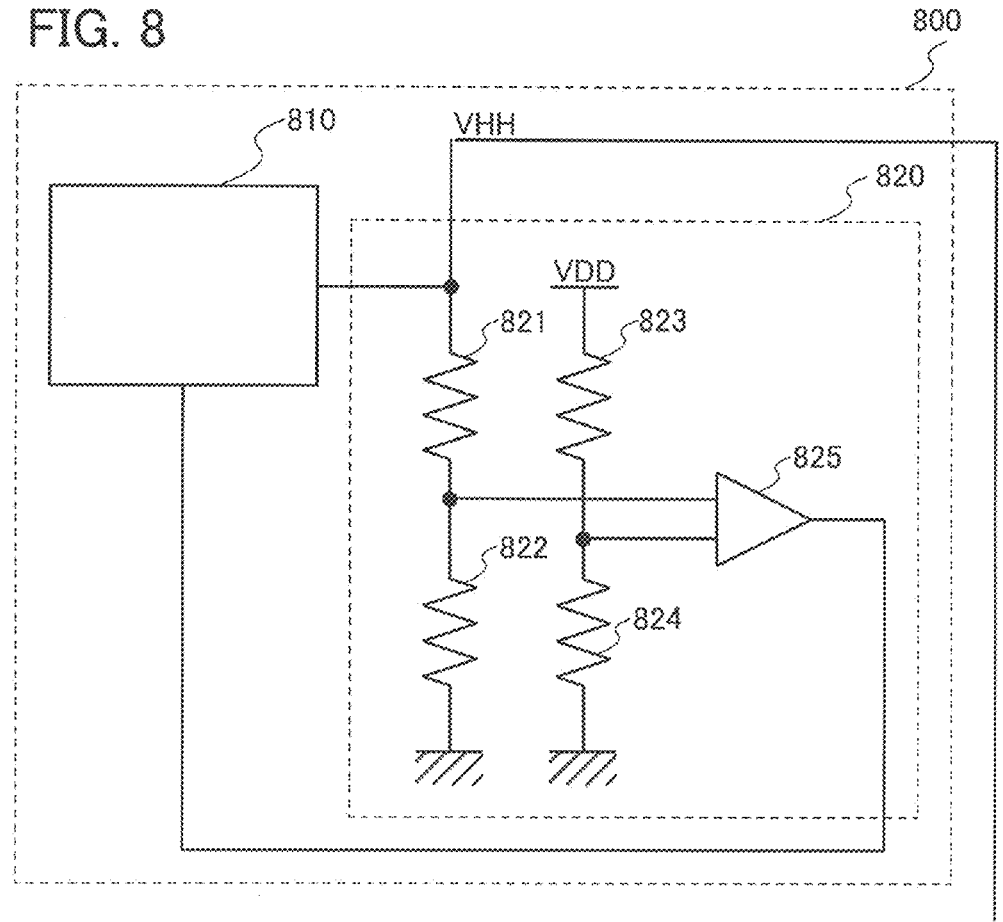
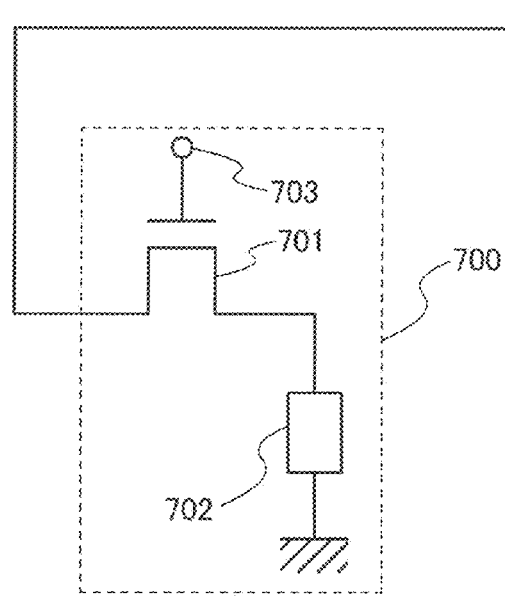

FIG. 15A
FIG. 15B
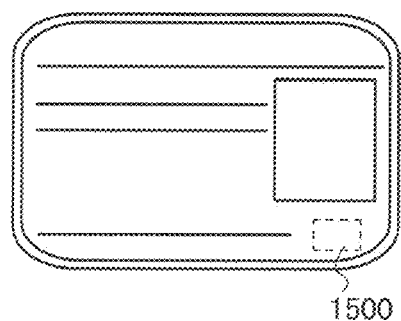
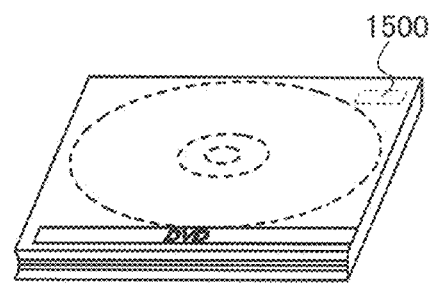
FIG. 15C
FIG. 15D
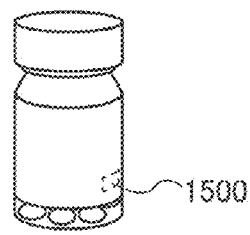
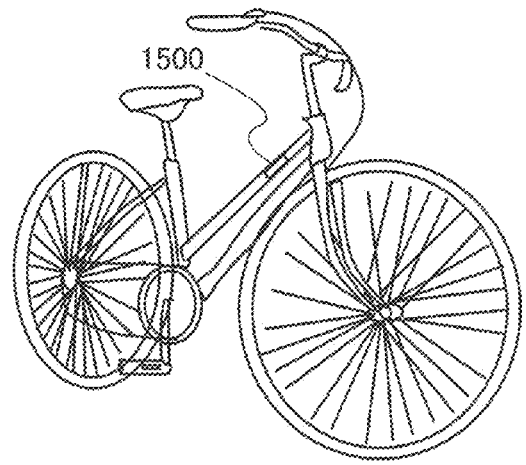
FIG. 15E
FIG. 15F
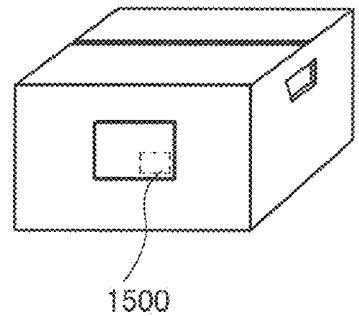

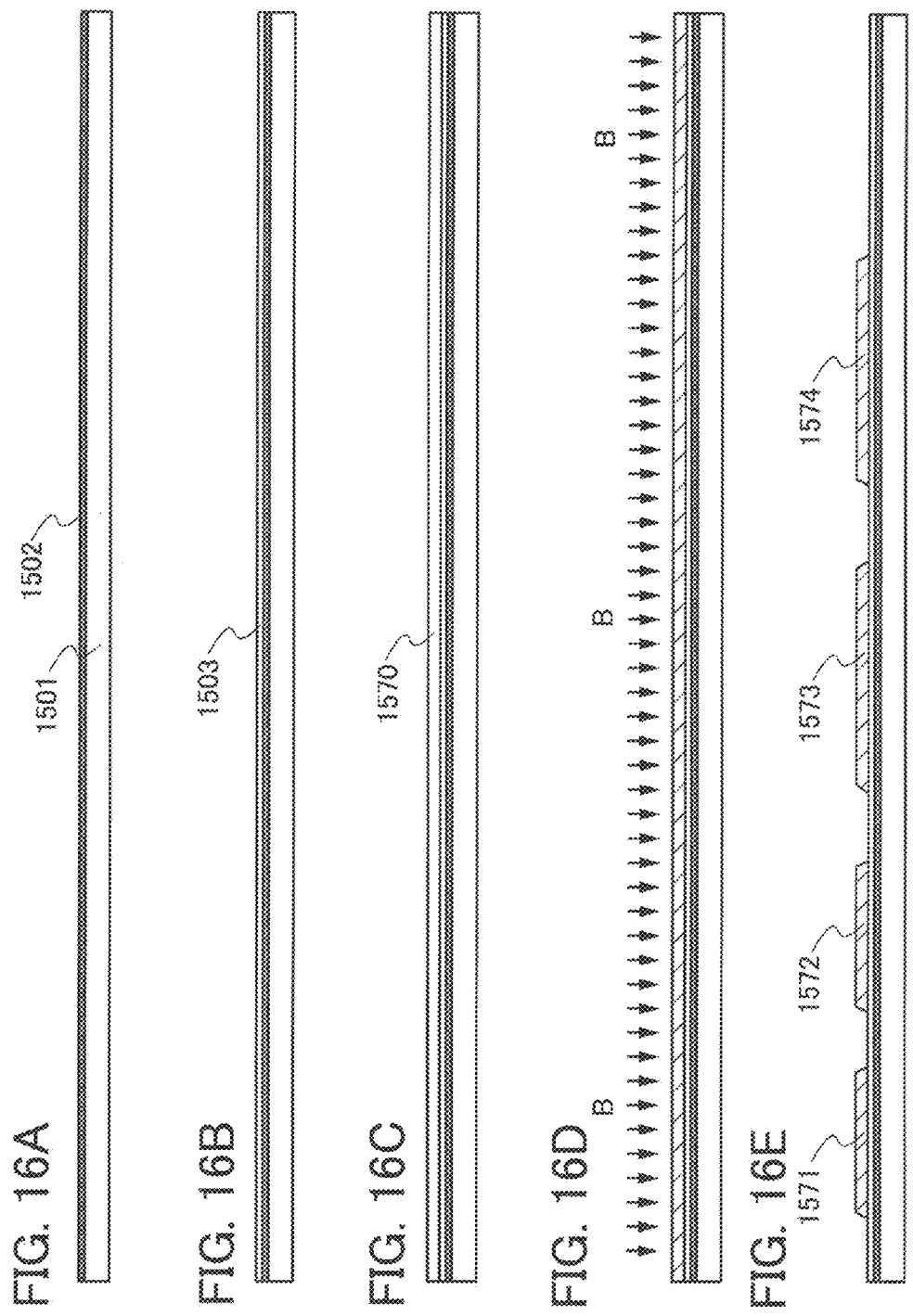

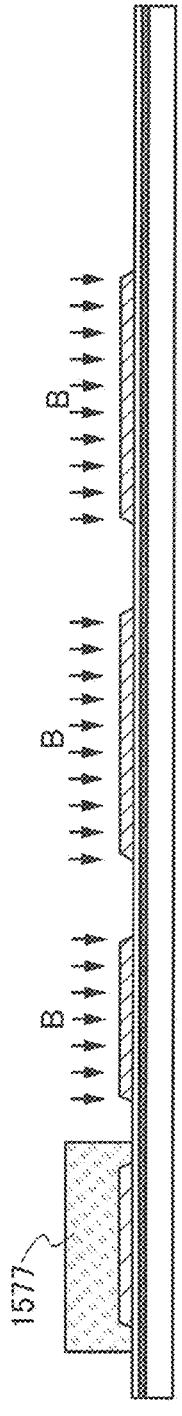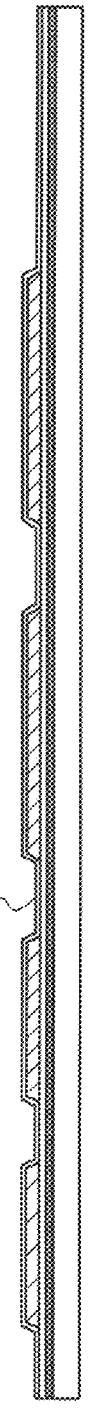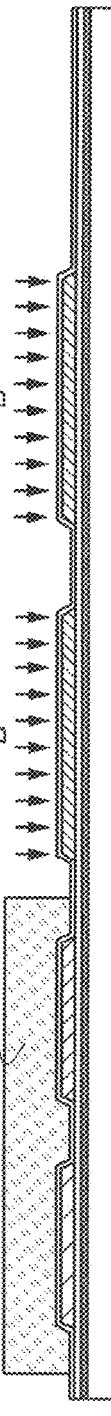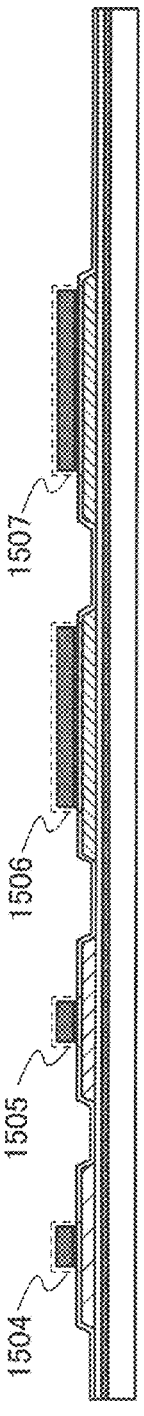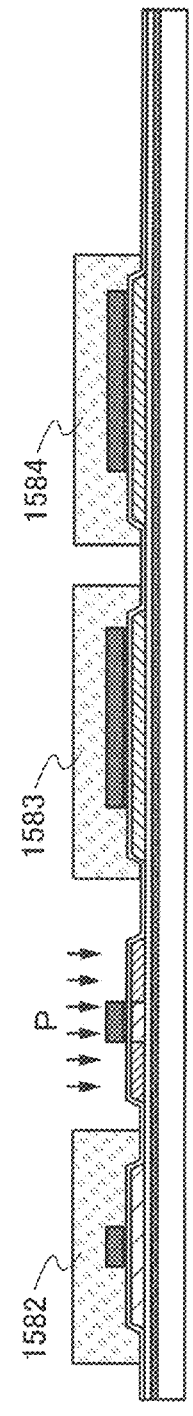

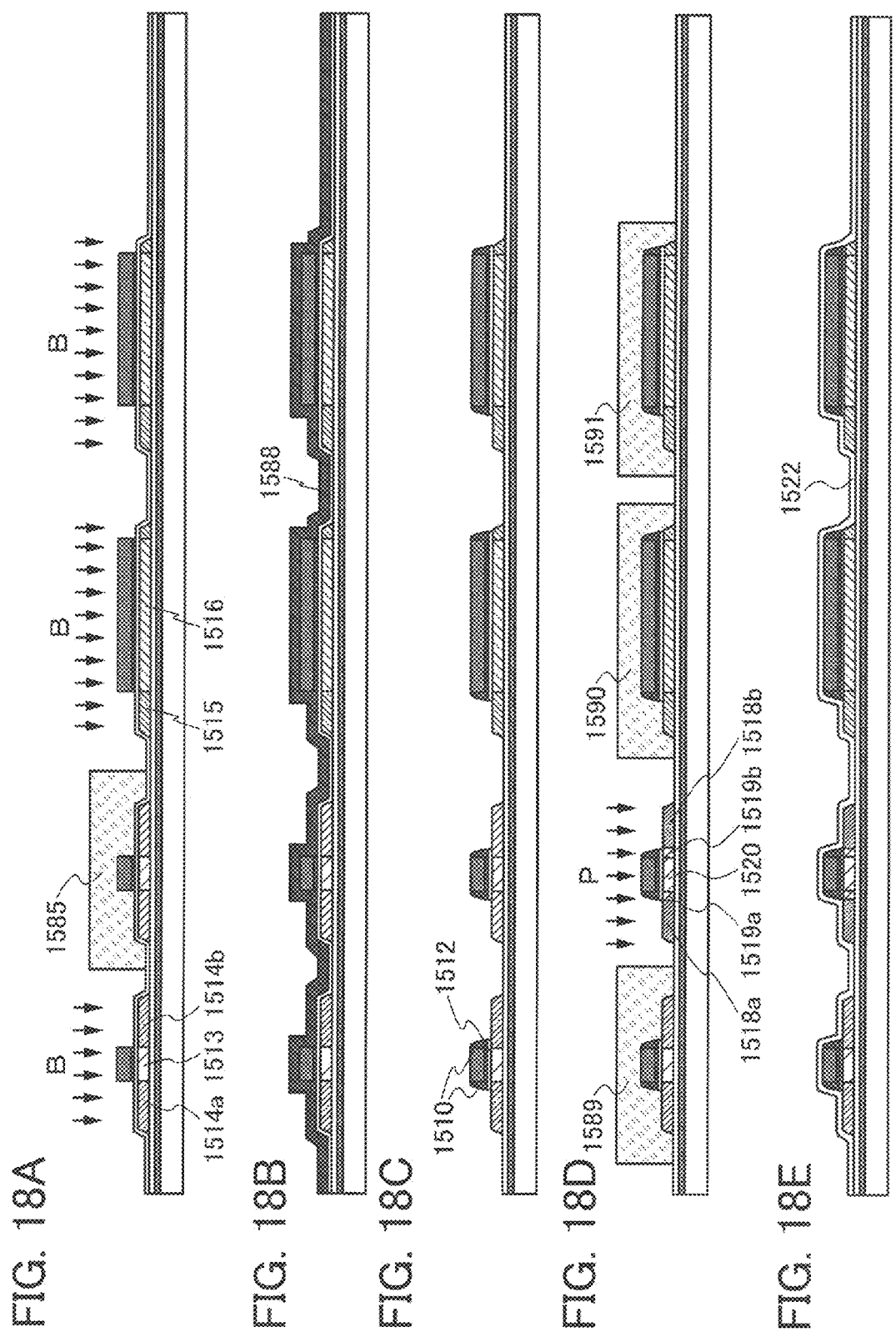

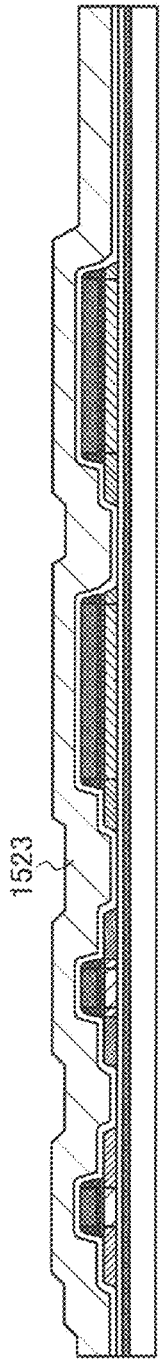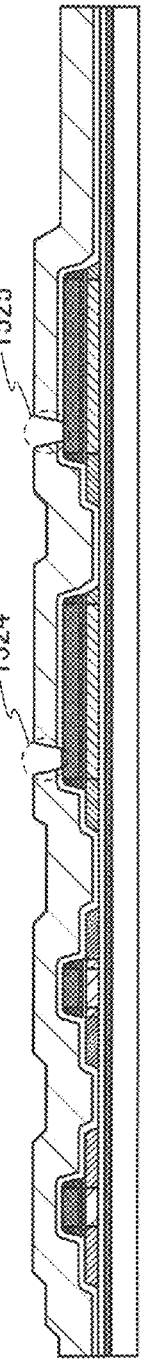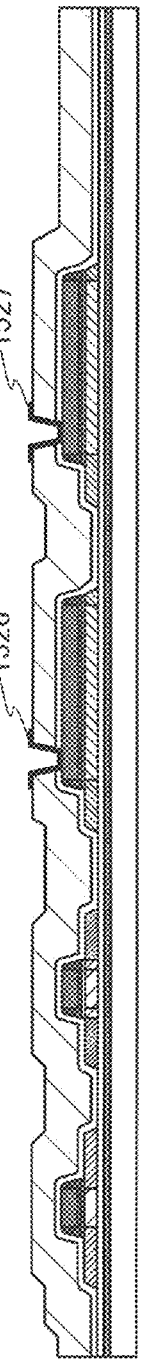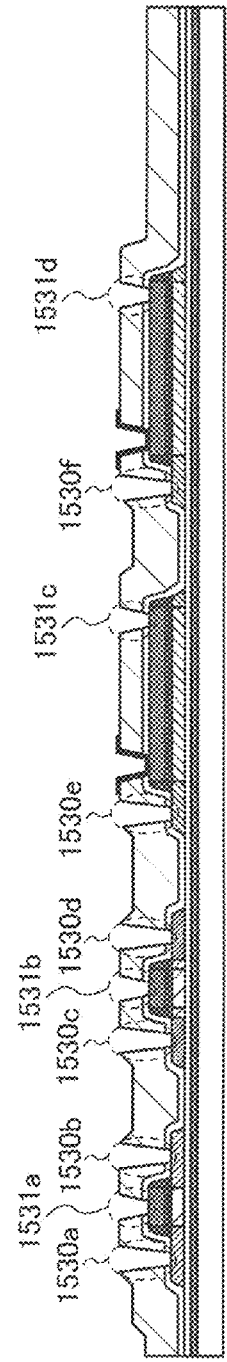

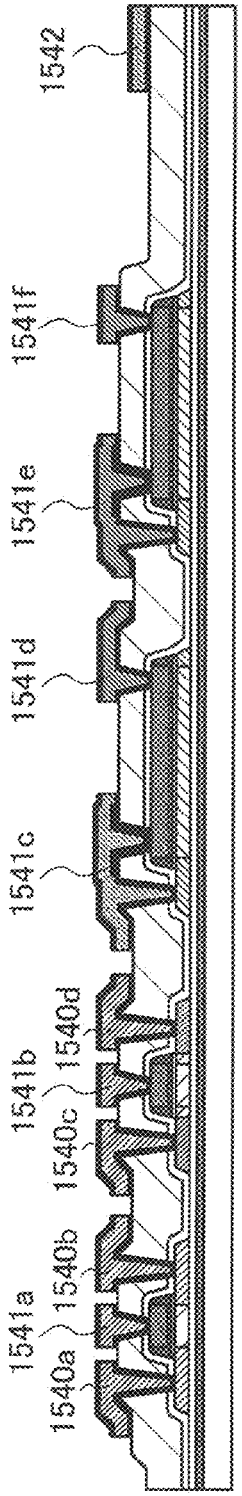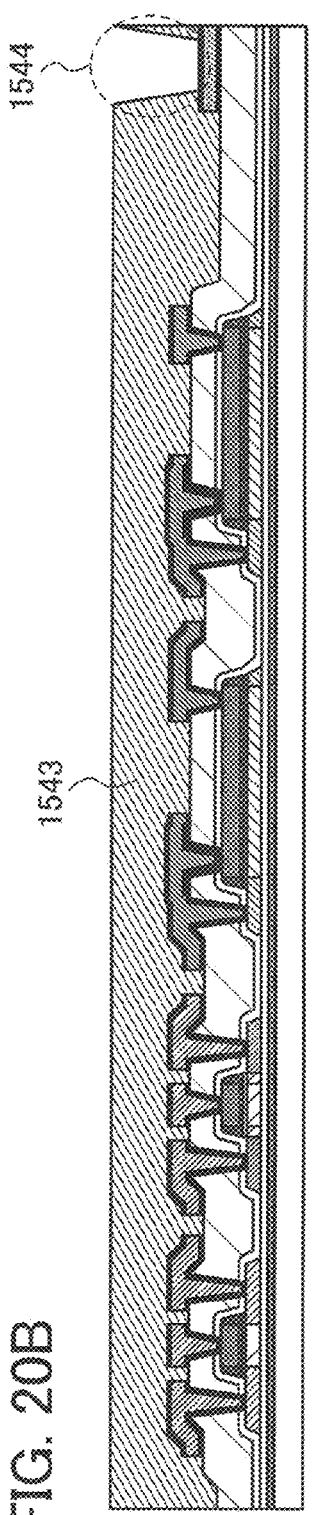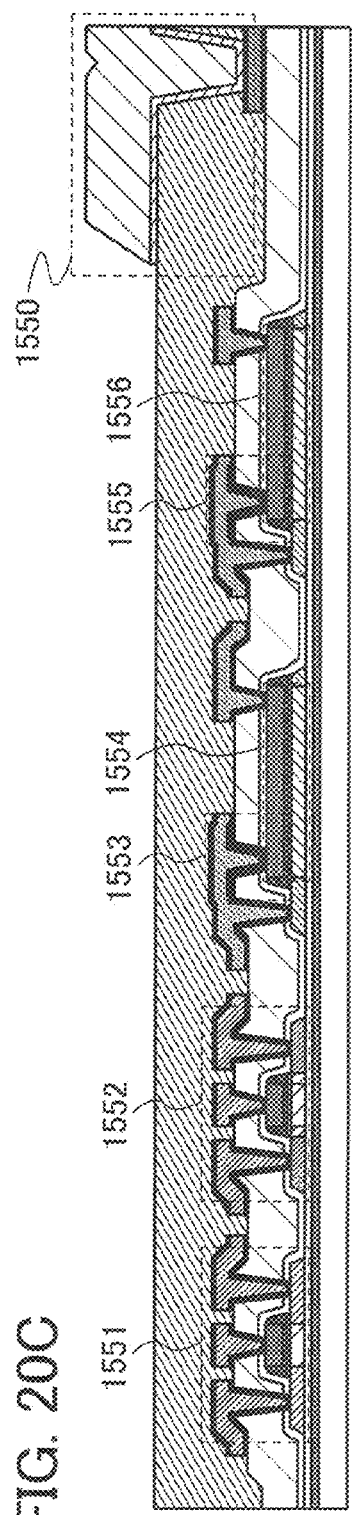

SEMICONDUCTOR DEVICE

BACKGROUND OF THE INVENTION

1. Field of the Invention

The present invention relates to a semiconductor device. In particular, the present invention relates to a semiconductor device having a wireless communication function.

Note that a semiconductor device in this specification refers to as a general device which can function by utilizing semiconductor characteristics, and electro-optical devices, semiconductor circuits, and electronic appliances are all semiconductor devices.

2. Description of the Related Art

Semiconductor devices having a wireless communication function for transmitting and receiving data wirelessly have been put into practical use in a variety of fields. Semiconductor devices having a wireless communication function is expected to further expand the market as a new mode of communication information terminals. In semiconductor devices having a wireless communication function, which are put into practical use, antennas and integrated circuits formed using semiconductor elements are formed over the same substrates. Further, semiconductor devices having a wireless communication function are also referred to as wireless tags, RF (radio frequency) tags, RFID (radio frequency identification) tags, IC (integrated circuit) tags, or ID (identification) tags.

The semiconductor device having a wireless communication function can communicate with a wireless communication device which is a power supply source and a transmitting and receiving device (also referred to as an interrogator, a reader/writer or R/W). Specifically, information of the semiconductor device can be read by an interrogator or the like. For example, by giving an identification number to the semiconductor device, an individual recognition can be performed by an interrogator.

In addition, a semiconductor device having a memory circuit portion including a plurality of memory elements and having a wireless communication function capable of writing information additionally has been developed.

As a memory element included in a memory circuit portion, a volatile memory and a nonvolatile memory are given. As a kind of memory element included in a nonvolatile memory, there is an antifuse memory element in which a memory layer is provided between a pair of conductors. In the antifuse memory element, when a high voltage is applied to the memory layer, an irreversible reaction occurs, so that a pair of conductors can be electrically connected to each other. That is, by identification of the resistance value of the antifuse memory element, binary data can be obtained.

An example of the above-described nonvolatile memory is disclosed in Patent Document 1. In an antifuse memory disclosed in Patent Document 1, amorphous silicon is provided between a pair of conductors. When a high voltage is applied to the amorphous silicon, a silicide reaction occurs, so that the pair of electrodes is electrically connected to each other. Such an antifuse memory is referred to as a one time programmable memory (OTP) memory, a one time programmable read only memory (OTPROM), a programmable read only memory (PROM), or the like.

REFERENCE

Patent Document

[Patent Document 1] Japanese Patent No. 3501416

SUMMARY OF THE INVENTION

In the above-described semiconductor device, various elements such as a switching element, a capacitor, and a resistor are provided in addition to the memory element. Therefore, in order to manufacture the semiconductor device, many steps are required and the manufacturing process becomes complicated. As a result, the manufacturing yield of the semiconductor devices is decreased or a manufacturing cost is increased.

In addition, many various elements are provided in the above-described semiconductor device. Thus, a large area is required for an integrated circuit included in the semiconductor device. When the resolution of the integrated circuit is increased, influence of parasitic capacitance between wirings or the like becomes apparent, whereby the area of the integrated circuit cannot be easily decreased.

In view of the above problems, an object of one embodiment of the present invention is to improve the manufacturing yield of semiconductor devices.

Further, an object of one embodiment of the present invention is to reduce a manufacturing cost of a semiconductor device.

Furthermore, an object of one embodiment of the present invention is to reduce the area of an integrated circuit included in a semiconductor device.

One embodiment of the present invention is a semiconductor device which includes a memory element including a first conductive layer, a memory layer over the first conductive layer, and a second conductive layer over the memory layer; and a resistor including a third conductive layer, a resistive layer over the third conductive layer, which is formed of the same material as the memory layer, and a fourth conductive layer over the resistive layer. The maximum value of the voltage applied to the memory layer is higher than the maximum value of the voltage applied to the resistor.

Note that in the above structure, a semiconductor device in which the first conductive layer and the third conductive layer, or the second conductive layer and the fourth conductive layer are formed of the same material is also one embodiment of the present invention.

In addition, in the above structure, a semiconductor device in which the first conductive layer and the third conductive layer, and the second conductive layer and the fourth conductive layer are formed of the same materials is another embodiment of the present invention.

Another embodiment of the present invention is a semiconductor device which includes a memory element including a first conductive layer, a memory layer over the first conductive layer, and a second conductive layer over the memory layer; and a resistor including a third conductive layer, a resistive layer over the third conductive layer, which is formed of the same material as the memory layer, and a fourth conductive layer over the resistive layer. The third conductive layer is a silicon electrode layer, and the resistive layer is a stacked layer of an amorphous silicon layer over the silicon electrode layer and an insulating layer over the amorphous silicon layer.

Note that in the above structure, a semiconductor device in which the maximum value of the voltage applied to the memory element is higher than the maximum value of the voltage applied to the resistor is also one embodiment of the present invention.

Further, in the above structure, a semiconductor device in which the second conductive layer and the fourth conductive layer are formed of the same material is also one embodiment of the present invention.

Furthermore, in the above structure, the contact area of the first conductive layer or the second conductive layer and the memory layer is larger than the contact area of the third conductive layer or the fourth conductive layer and the resistive layer is another embodiment of the present invention.

A memory layer of a memory element and a resistive layer of a resistor are formed of the same material in a semiconductor device according to one embodiment of the present invention. Therefore, the memory layer and the resistive layer can be formed in the same step, whereby the number of manufacturing steps of the semiconductor device can be reduced. As a result, the manufacturing yield of the semiconductor devices can be increased or the manufacturing cost of the semiconductor device can be reduced.

In addition, the semiconductor device according to one embodiment of the present invention has a resistor including a resistive layer having high resistance value. Therefore, the area of an integrated circuit included in the semiconductor device can be reduced.

BRIEF DESCRIPTION OF THE DRAWINGS

FIG. 4A is a cross-sectional view of the configuration of the memory circuit included in the semiconductor device described in Embodiment 2, and FIG. 4B is a cross-sectional view of the configuration of the flag circuit included in the semiconductor device described in Embodiment 2.

FIGS. 5A to 5C are cross-sectional views showing manufacturing steps of elements included in the semiconductor device described in Embodiment 2.

FIGS. 6A to 6C are cross-sectional views showing the manufacturing steps of the elements included in the semiconductor device described in Embodiment 2.

FIG. 8 is a circuit diagram of a boosting circuit and a memory circuit which are included in a semiconductor device described in Embodiment 4.

FIGS. 15A to 15F show semiconductor devices described in Embodiment 8.

FIGS. 16A to 16E are cross-sectional views showing manufacturing steps of elements included in a semiconductor device described in Example 1.

FIGS. 17A to 17E are cross-sectional views showing the manufacturing steps of the elements included in the semiconductor device described in Example 1.

FIGS. 18A to 18E are cross-sectional views showing the manufacturing steps of the elements included in the semiconductor device described in Example 1.

FIGS. 19A to 19D are cross-sectional views showing the manufacturing steps of the elements included in the semiconductor device described in Example 1.

FIGS. 20A to 20C are cross-sectional views showing the manufacturing steps of the elements included in the semiconductor device described in Example 1.

DETAILED DESCRIPTION OF THE INVENTION

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention is not interpreted as being limited to the descriptions of the embodiments below.

Note that since a source electrode and a drain electrode of a transistor change depending on the structure, the operating condition and the like of the transistor, it is difficult to define which is a source electrode or a drain electrode. Thus, in this document, one of a source electrode and a drain electrode is referred to as a first electrode and the other thereof is referred to as a second electrode for distinction.

In addition, the size, the thickness of a layer, or a region of each structure shown in drawings or the like in each embodiment is exaggerated for simplicity in some cases. Therefore, embodiments of the present invention are not limited to such scales. In addition, in this specification, ordinal numbers such as "first", "second", and "third" are used in order to avoid confusion among components, and the terms do not limit the components numerically.

Embodiment 1

In this embodiment, an example of a semiconductor device including a memory element and a resistor is described with reference to FIGS. 1A to 1D.

Figure 1A:
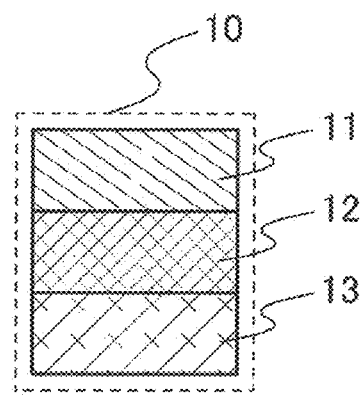
FIGS. 1A and 1B show the structures of a memory element and a resistor which are included in a semiconductor device described in Embodiment 1.
Figure 1B:
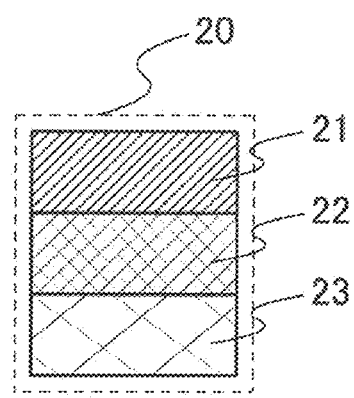

FIG. 1A and FIG. 1B show a memory element 10 and a resistor 20 respectively, which are included in the semiconductor device of this embodiment. The memory element 10 shown in FIG. 1A includes a conductive layer 13, a memory layer 12 over the conductive layer 13, and a conductive layer 11 over the memory layer 12. The resistor 20 shown in FIG. 1B includes a conductive layer 23, a resistive layer 22 over the conductive layer 23, and a conductive layer 21 over the resistive layer 22. Note that the memory layer 12 and the resistive layer 22 are formed of the same material. In addition, the memory element 10 has a function of electrically connecting the conductive layer 11 and the conductive layer 13 by an irreversible reaction which is caused by dielectric breakdown of the memory layer 12 due to application of a voltage higher than a certain voltage.

Figure 1C:
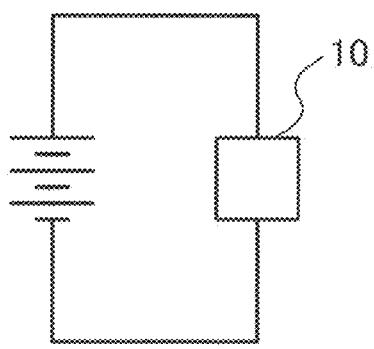
FIGS. 1C and 1D are circuit diagrams each showing voltage applied to the memory element and resistor which are included in the semiconductor device described in Embodiment 1.
Figure 1D:
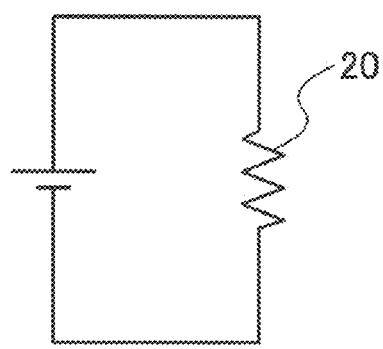

Further, FIG. 1C schematically shows the maximum value of a voltage applied to the memory element 10 in the semiconductor device of this embodiment. FIG. 1D schematically shows the maximum value of a voltage applied to the resistor 20 in the semiconductor device of this embodiment. As shown in FIGS. 1C and 1D, the maximum value of the voltage applied to the memory element 10 is higher than that applied to the resistor 20. Specifically, the maximum value of the voltage applied to the memory element 10 is higher than the voltage required to cause an irreversible reaction in the memory layer 12 so that the conductive layer 11 and the conductive layer 13 are electrically connected to each other. The maximum value of the voltage applied to the resistor 20 is lower than the voltage required to cause an irreversible reaction in the memory layer 12 so that the conductive layer 11 and the conductive layer 13 are electrically connected to each other. Therefore, dielectric breakdown of the resistive layer 22 in the resistor 20 does not occur although the resistive layer 22 and the memory layer 12 are formed of the same material. That is, the resistive layer 22 can function as a resistor in the semiconductor device.

The memory layer of the memory element and the resistive layer of the resistor element are formed of the same material in the semiconductor device of this embodiment. That is, the memory layer and the resistive layer can be formed in the same step. Consequently, the number of manufacturing steps of the semiconductor device can be reduced. As a result, the manufacturing yield of the semiconductor devices can be increased and the manufacturing cost of the semiconductor device can be reduced. Moreover, the circuit area required for the resistor 20 can be reduced by formation of the resistive layer 22 using a material having high resistance value used for the memory layer 12.

Further, not only the memory layer of the memory element and the resistive layer of the resistor but also all the layers of the memory element and all the layers of the resistor can be formed of the same materials. That is, the conductive layer 11 of the memory element 10 and the conductive layer 21 of the resistor 20 can be formed of the same material, and the conductive layer 13 of the memory element 10 and the conductive layer 23 of the resistor 20 can be formed of the same material. Accordingly, the conductive layers 11 and 21 and the conductive layers 13 and 23 can be formed using the same steps, so that the number of manufacturing steps of the semiconductor device can be reduced. Note that one of a pair of electrodes included in the memory element and one of a pair of electrodes included in the resistor can also be formed of the same material.

Note that the contents or a part of the contents of this embodiment can be combined with any of the contents or a part of the contents of the other embodiments or example as appropriate.

Embodiment 2

In this embodiment, examples of a semiconductor device in which a memory element and a resistor are formed over the same substrate and a manufacturing method thereof are described with reference to FIGS. 2A and 2B, FIGS. 3A and 3B, FIGS. 4A and 4B, FIGS. 5A to 5C, and FIGS. 6A to 6C. Specifically, a semiconductor device including a memory circuit and a flag circuit, which prevents an interrogator from reading the same information twice, is described.

<Memory Circuit>

Figure 2A:
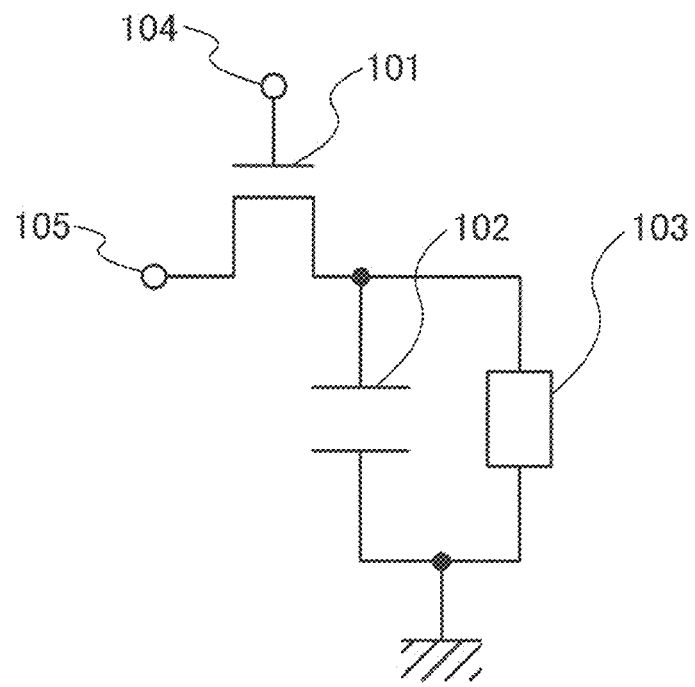
FIG. 2A shows a circuit diagram of a memory circuit included in a semiconductor device described in Embodiment 2.

FIG. 2A shows an example of a circuit configuration of the memory circuit included in the semiconductor of this embodiment. The memory circuit shown in FIG. 2A includes a transistor 101, a capacitor 102, and a memory element 103. In addition, a gate electrode and a first electrode of the transistor 101 are electrically connected to a control terminal 104 and an input-output terminal 105 respectively. One electrode of the capacitor 102 is electrically connected to a second electrode of the transistor 101 and the other thereof is grounded. One electrode of the memory element 103 is electrically connected to the first electrode of the transistor 101 and one electrode of the capacitor 102, and the other thereof is grounded.

In the memory circuit shown in FIG. 2A, switching of the transistor 101 is controlled by a signal input from the control terminal 104, and data is written to and read from the memory element 103 when the transistor 101 is turned on. A signal is input from the input-output terminal 105 into one electrode of the memory element 103 when data is written. At this time, if a voltage applied to the memory element 103 is a writing voltage or higher, data is written to the memory element 103. Further, data is read by outputting a potential of one electrode of the memory element 103 to the input-output terminal 105. Note that the capacitor 102 is provided so as to improve yield of writing (the probability of success in writing data) to the memory element 103. That is, the memory circuit in this embodiment can function even if the capacitor 102 is not provided.

<Flag Circuit>

Figure 2B:
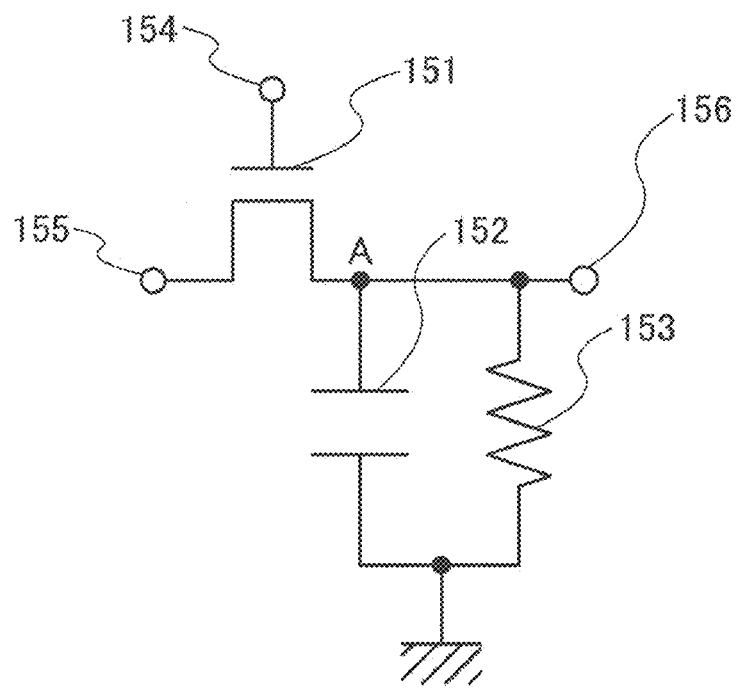
FIG. 2B shows a circuit diagram of a flag circuit included in the semiconductor device described in Embodiment 2.

FIG. 2B shows an example of a circuit configuration of the flag circuit included in the semiconductor device of this embodiment. Note that the flag circuit has a function of preventing information from being read after it has been read from the semiconductor device (duplicate reading). Specifically, the flag circuit is a volatile memory to which a signal is input and which can hold the signal for a certain period. The flag circuit shown in FIG. 2B includes a transistor 151, a capacitor 152, and a resistor 153. In addition, a gate electrode and a first electrode of the transistor 151 are electrically connected to a control terminal 154 and an input terminal 155 respectively. One electrode of the capacitor 152 is electrically connected to a second electrode of the transistor 151 and an output terminal 156, and the other thereof is grounded. One electrode of the resistor 153 is electrically connected to the second electrode of the transistor 151, one electrode of the capacitor 152 and the output terminal 156, and the other thereof is grounded.

Note that a buffer (not shown) is provided in a next stage of the flag circuit (to which the output terminal 156 is connected). The buffer outputs a high voltage electric potential when an output signal of the flag circuit (a potential of a node A) is a certain value or higher. The buffer outputs a low voltage electric potential when the output signal of the flag circuit is lower than the certain value. For example, the buffer can be formed by connecting two stages of inverters in series. At this time, the output terminal 156 is electrically connected to a gate electrode of transistor which forms the inverter. Therefore, in the next stage to which the output terminal 156 is connected, a signal is input to the buffer; however, electrical connection is terminated.

In the flag circuit shown in FIG. 2B, on and off of the transistor 151 are controlled by a signal input from the control terminal 154. Note that a reading signal input from an external interrogator corresponds to the signal. Since the transistor 151 is turned on by the reading signal, a signal is input from the input terminal 155 to the flag circuit. Specifically, charge is accumulated in the capacitor 152. Accordingly, the potential of the node A becomes a potential corresponding to the charge accumulated in the capacitor 152, and is output from the output terminal 156 to the buffer in the next stage. Note that at this time, the potential of the node A is a potential necessary for the buffer in the next stage to output a high voltage electric potential or higher.

Next, when the reading signal from the external interrogator stops, the transistor 151 is turned off. Accordingly, the potential of the node A which is grounded through the resistor 153 is lowered to a ground potential. Note that time required for the potential of the node A to reach the ground potential can be controlled by resistance value of the resistor 153. Specifically, speed of decrease in the potential of the node A can be slowed down by setting the resistance value of the resistor 153 higher. On the other hand, in the case where the potential of the node A becomes a certain value or less, an output signal of the buffer provided in the next stage of the flag circuit changes into a low voltage electric potential. That is, holding time of the output signal of the buffer can be controlled by the resistance value of the resistor 153. In the semiconductor device of this embodiment, a reading operation of the memory circuit or the like is set to be performed with reference to a reading signal input from the external interrogator and an output signal of the buffer. Thus, the external interrogator can be prevented from reading the same information twice in the case where a reading signal is input from the external interrogator plural times in a short time.

<Configurations of Memory Circuit and Flag Circuit>

Figure 3A:
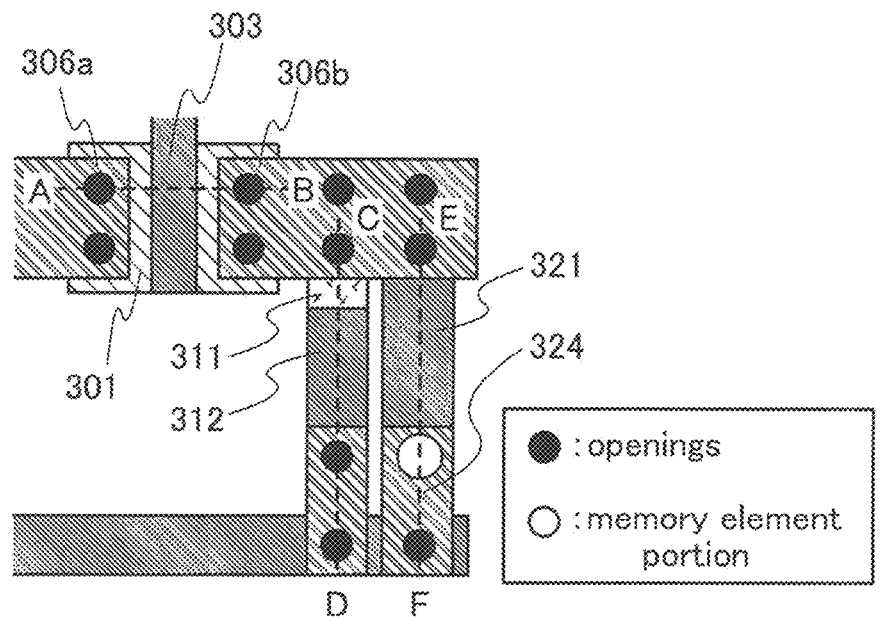
FIG. 3A is a top view of a configuration of the memory circuit included in the semiconductor device described in Embodiment 2.
Figure 3B:
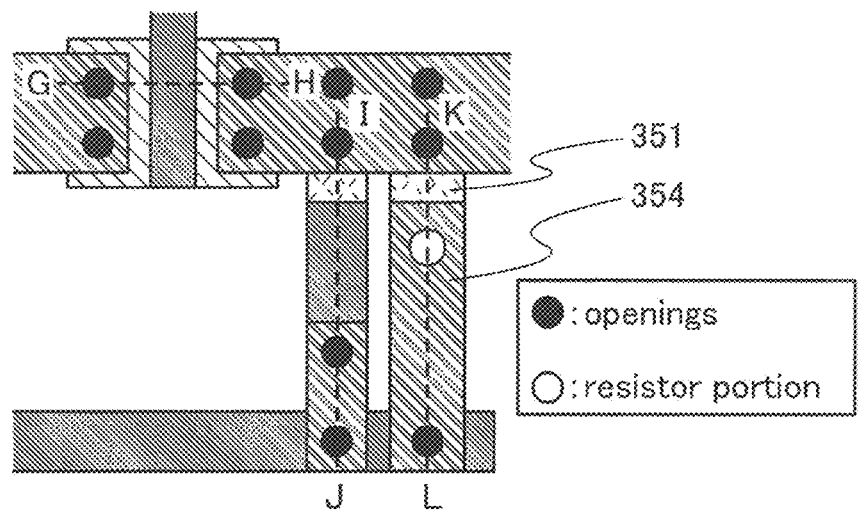
FIG. 3B is a top view of a configuration of the flag circuit included in the semiconductor device described in Embodiment 2.

FIGS. 3A and 3B and FIGS. 4A and 4B show examples of the configurations of the memory circuit and the flag circuit included in the semiconductor device of this embodiment. FIG. 3A shows a top view of the memory circuit and FIG. 3B shows a top view of the flag circuit. FIG. 4A shows a cross-sectional view taken along lines A-B, C-D, and E-F of the top view of the memory circuit shown in FIG. 3A. FIG. 4B shows a cross-sectional view taken along lines G-H, I-J, and K-L of the top view of the flag circuit shown in FIG. 3B.

The transistor 101 included in the memory circuit shown in FIGS. 3A and 4A includes a semiconductor layer 301 over a substrate 300; an insulating layer 302 over the semiconductor layer 301; a conductive layer 303 over the insulating layer 302; and conductive layers 306a and 306b which are electrically connected to the semiconductor layer 301 in openings provided in insulating layers 304 and 305 over the conductive layer 303. Further, the semiconductor layer 301 is formed using a semiconductor including silicon as a main structural element. A channel formation region 307a and impurity regions 307b and 307c are formed in the semiconductor layer 301. Furthermore, the conductive layers 306a and 306b are formed so as to be in contact with the impurity regions 307b and 307c respectively. In the transistor 101, the insulating layer 302 functions as a gate insulating layer, the conductive layer 303 functions as a gate electrode, and the conductive layers 306a and 306b function as a first electrode and a second electrode.

The capacitor 102 included in the memory circuit shown in FIGS. 3A and 4A includes a silicon electrode layer 311 over the substrate 300; the insulating layer 302 over the silicon electrode layer 311; and a conductive layer 312 over the insulating layer 302. Note that a silicon electrode layer is a low-resistance silicon layer which can function as an electrode by introduction of an impurity element at high concentration and by crystallization. In addition, the conductive layer 312 is formed of the same material as the conductive layer 303. In the capacitor 102, the silicon electrode layer 311, the insulating layer 302, and the conductive layer 312 function as one electrode, a dielectric, and the other electrode respectively.

The memory element 103 included in the memory circuit shown in FIGS. 3A and 4A includes a conductive layer 321 over the substrate 300; an amorphous silicon layer 322 over the conductive layer 321; a silicon oxynitride layer 323 over the amorphous silicon layer 322; and a conductive layer 324 over the silicon oxynitride layer 323. Note that the conductive layer 321 is formed of the same material as the conductive layers 303 and 312, and the conductive layer 324 is formed of the same material as the conductive layers 306a and 306b. Further, in this specification, silicon oxynitride contains more oxygen than nitrogen and, in the case where measurements are performed using Rutherford backscattering spectrometry (RBS) and hydrogen forward scattering (HFS), includes oxygen, nitrogen, silicon, and hydrogen as composition ranging from 50 at. % to 70 at. %, 0.5 at. % to 15 at. %, 25 at. % to 35 at. %, and 0.1 at. % to 10 at. % respectively. Note that the total amount of the above elements is 100 at. %. In the memory element 103, the conductive layer 321 functions as one electrode, the amorphous silicon layer 322 and the silicon oxynitride layer 323 function as a memory layer, and the conductive layer 324 functions as the other electrode.

The transistor 151 included in the flag circuit shown in FIGS. 3B and 4B has the same configuration as the transistor 101 included in the memory circuit. Therefore, the above description is to be referred to. Note that detailed design conditions of the transistor 151 such as a diameter of an opening and a width of each layer are not needed to be the same as those of the transistor 101. The transistor 151 included in the flag circuit and the transistor 101 included in the memory circuit may be designed independently.

The capacitor 152 included in the flag circuit shown in FIGS. 3B and 4B has the same configuration as the capacitor 102 included in the memory circuit. Therefore, the above description is to be referred to. Note that detailed design conditions such as a diameter of an opening and width of each layer is not need to be the same between the capacitors 152 and 102. The capacitor 152 included in the flag circuit and the capacitor 102 included in the memory circuit may be designed independently.

The resistor 153 included in the flag circuit shown in FIGS. 3B and 4B includes a silicon electrode layer 351 over the substrate 300; an amorphous silicon layer 352 over the silicon electrode layer 351; a silicon oxynitride layer 353 over the amorphous silicon layer 352; and a conductive layer 354 over the silicon oxynitride layer 353. Note that the silicon electrode layer 351 is formed of the same material as the silicon electrode layer 311 included in the memory circuit, and the conductive layer 354 is formed of the same material as the conductive layers 306a and 306b and the conductive layer 324 included in the memory circuit. In the resistor 153, the silicon electrode layer 351 functions as one electrode, the amorphous silicon layer 322 and the silicon oxynitride layer 323 function as a resistive layer, and the conductive layer 354 functions as the other electrode.

In the semiconductor device of this embodiment, both the memory element 103 included in the memory circuit and the resistor 153 included in the flag circuit have a structure in which an amorphous silicon layer and a silicon oxynitride layer are provided between a pair of electrodes. However, the maximum value of the voltage applied is different between the memory element 103 and the resistor 153. Specifically, the maximum value of a voltage applied to the memory element 103 is a voltage value required to cause a silicide reaction between the conductive layer 321 and the amorphous silicon layer 322 and dielectric breakdown of the silicon oxynitride layer (also referred to as the writing voltage), or higher. On the other hand, the maximum value of the voltage applied to the resistor 153 is lower than the writing voltage. Therefore, the amorphous silicon layer and the silicon oxynitride layer can be used as the memory layer of the memory element in the memory circuit, and also can be used as the resistive layer of the resistor in the flag circuit.

Further, in the memory element 103, by dielectric breakdown of the amorphous silicon layer 322 and the silicon oxynitride layer 323, the conductive layers 321 and 324 are electrically connected to each other. Note that dielectric breakdown of the whole region sandwiched between the conductive layers 321 and 324 is not needed. In other words, a path of current may be secured between the conductive layers 321 and 324, and dielectric breakdown may occur in a part of the amorphous silicon layer 322 and the silicon oxynitride layer 323. That is, in the memory element 103, the larger the contact area between the conductive layers 321 and 324, and the amorphous silicon layer 322 and the silicon oxynitride layer 323 which function as the memory layer is, the more yield of writing (the probability of success in writing data) can be improved. In consideration of the above description, the diameter of an opening formed in the memory element 103 is designed to be larger than that of an opening formed in the resistor 153 in the semiconductor device of this embodiment.

In addition, even if the maximum value of a voltage applied is the writing voltage in the memory element or higher, the resistor 153 can function if the voltage is the voltage value required for dielectric breakdown of the stacked layer of the amorphous silicon layer 352 and the silicon oxynitride layer 353, or less. The reason of this is as follows. The silicon electrode layer 351 is used as an electrode which is in contact with the amorphous silicon layer 352 in the resistor 153. Therefore, even in the case where a voltage appropriately same as the writing voltage is applied to the resistor 153, a silicide reaction does not occur. As a result, a pair of electrode included in the resistor 153 is not electrically connected to each other. Note that the above description can be applied, if a silicon electrode layer is used as one electrode of the resistor and an amorphous silicon layer is used as a resistive layer which is in contact with the silicon electrode layer. For example, even with the structure in which the above-described silicon oxynitride layer 353 is replaced with another insulating layer as appropriate, the resistor can have the above-described function.

<Manufacturing Method of Memory Circuit and Flag Circuit>

An example of a manufacturing method of the memory circuit and the flag circuit shown in FIGS. 3A and 3B and FIGS. 4A and 4B is described with reference to FIGS. 5A to 5C and FIGS. 6A to 6C. Specifically, a manufacturing method of elements included in the circuits using a photolithography method is described. Note that the memory circuit and the flag circuit shown in FIGS. 3A and 3B and FIGS. 4A and 4B have a common transistor structure and a common capacitor structure. Therefore, the transistor 101, the capacitor 102, and the memory element 103 each included in the memory circuit, and the resistor 153 included in the flag circuit are shown in FIGS. 5A to 5C and FIGS. 6A to 6C.

First, a semiconductor layer is formed over a substrate 400. As the substrate 400, a glass substrate, a quartz substrate, a metal substrate such as a stainless steel substrate, a ceramic substrate, a plastic substrate, or the like can be used. Note that a plastic substrate made of polyethylene terephthalate (PET), polyethylene naphthalate (PEN), polyether sulfone (PES), acrylic, or the like can be used. The semiconductor layer can be formed using a semiconductor material such as an element belonging to Group 14 of the periodic table, such as silicon (Si) or germanium (Ge), a compound such as silicon germanium (Site) or gallium arsenide (GaAs), an oxide such as zinc oxide (ZnO) or zinc oxide containing indium (In) and gallium (Ga), or an organic compound showing semiconductor characteristics, or the like can be used. A layer having a stacked-layer structure of these semiconductor materials can be used. Here, a layer which includes silicon as the main structural element is used as the semiconductor layer. Note that a thin film deposition method such as a plasma CVD method or a sputtering method can be used for forming the semiconductor layer. Furthermore, for crystallization of the semiconductor layer, a laser crystallization method, a thermal crystallization method using rapid thermal anneal (RTA) or an annealing furnace, a crystallization method using a metal element, such as nickel, which promotes crystallization, or the like, can be used. Note that to control the threshold voltage of a thin film transistor formed later, an impurity element may be slightly added to the semiconductor layer, if needed. As the impurity element, boron (B) imparting p-type conductivity to a semiconductor or phosphorus (P) imparting n-type conductivity to a semiconductor can be used.

Next, a resist is formed on the semiconductor layer using a photolithography method. The resist is used as a mask and the semiconductor layer is selectively etched, whereby semiconductor layers 402a, 402b, and 402c are formed (see FIG. 5A).

Subsequently, an insulating layer 403 is formed over the substrate 400 and the semiconductor layers 402a, 402b, and 402c. The insulating layer 403 can be formed using insulating materials such as silicon oxide, silicon nitride, silicon oxynitride, or silicon nitride oxide. Silicon oxynitride contains more oxygen than nitrogen and, in the case where measurements are performed using RBS and HFS, includes oxygen, nitrogen, silicon, and hydrogen as composition ranging from 5 to 30 at. %, 20 to 55 at. %, 25 to 35 at. %, and 10 to 30 at. %, respectively. Note that the total amount of the above elements is 100 at. %. A layer having a stacked-layer structure of these insulating materials can be used as the insulating layer 403. Note that the insulating layer 403 is used as a gate insulating layer in a region where a transistor is later formed, and as a dielectric provided between a pair of electrodes in a region where a capacitor is later formed. Furthermore, a thin film deposition method such as a plasma CVD method or a sputtering method can be used for forming the insulating layer 403.

Next, a resist which covers at least the semiconductor layer 402a is formed using a photolithography method. In addition, a high-concentration impurity element is added to the semiconductor layers 402b and 402c with the use of the resist as a mask, so that silicon electrode layers 404a and 404b are formed (see FIG. 5B). As the impurity element, boron (B) imparting p-type conductivity to a semiconductor or phosphorus (P) imparting n-type conductivity to a semiconductor can be used. Note that in the case where a capacitor later used for an assist capacitor is formed and a semiconductor layer containing a high-concentration impurity element is used as an electrode in a memory element portion, an impurity element imparting p-type conductivity is preferably added to the semiconductor layer.

Next, a conductive layer is formed over the insulating layer 403. The conductive layer can be formed using an elemental metal, an alloy, or a conductive material selected from a compound including a metal element. The conductive layer may have a stacked-layer structure formed of these conductive materials. Note that since a gate electrode of the transistor is later formed from the conductive layer, a high melting point material is preferably used for the conductive layer. In addition, since an electrode of the memory element which is in contact with an amorphous silicon layer is later formed from the conductive layer, a material which causes a silicide reaction easily is preferably used for the conductive layer. Specifically, the conductive layer is formed using an element such as tungsten (W), titanium (Ti), molybdenum (Mo), cobalt (Co), hafnium (Hf), nickel (Ni), zirconium (Zr), chromium (Cr), vanadium (V), palladium (Pd) or platinum (Pt), or an alloy or a compound containing any of these as a main component. Moreover, in the case where the conductive layer has a stacked-layer structure, a material layer which serves as an upper layer may be formed using the above-described materials, and a material layer which serves as a lower layer on the insulating layer 403 side may be formed using appropriate materials. Note that a thin film deposition method such as a sputtering method can be used for forming the conductive layer.

Next, a resist is formed on the conductive layer using a photolithography method. Further, conductive layers 405a, 405b, 405c, 405d, 405e, and 405f are formed with the use of the resist as a mask.

Subsequently, a resist which covers at least the silicon electrode layers 404a and 404b and the conductive layers 405b, 405c, 405d, 405e, and 405f is formed using a photolithography method. The conductive layer 405a is further used as a mask and an impurity element is added to the semiconductor layer 402a, whereby impurity regions 406a and 406b are formed (see FIG. 5C). As the impurity element, boron (B) imparting p-type conductivity to a semiconductor or phosphorus (P) imparting n-type conductivity to a semiconductor can be used. Note that the impurity concentration in the impurity regions 406a and 406b is lower than that in the silicon electrode layers 404a and 404b. The impurity regions 406a and 406b function as a source region and a drain region of a transistor which is later formed.

Next, an insulating layer 407 is formed over the insulating layer 403 and the conductive layers 405a, 405b, 405c, 405d, 405e, and 405f. The insulating layer 407 can be formed using an insulating material such as silicon oxide, silicon nitride, silicon oxynitride or silicon nitride oxide. The insulating layer 407 may have a stacked-layer structure formed of these insulating materials. Further, an insulating layer 408 is formed over the insulating layer 407. The insulating layer 408 can be formed using an insulating material such as silicon oxide, silicon nitride, silicon oxynitride, silicon nitride oxide, or an organic material (i.e., polyimide, polyamide, polyvinyl phenol, benzocyclobutene, acrylic, or epoxy). The insulating layer 408 may have a stacked-layer structure formed of these insulating materials. Note that a thin film deposition method such as a plasma CVD method, a sputtering method, or an application method such as a spin coating method can be used for forming the insulating layers 407 and 408.

Next, a resist is selectively formed on the insulating layer 408 using a photolithography method. Further, an opening 409a penetrating through the insulating layers 407 and 408 to reach the conductive layer 405d, and an opening 409b penetrating through the insulating layers 403, 407 and 408 to reach the silicon electrode layer 404b are formed using the resist as a mask. Note that the openings 409a and 409b are formed in a region later used as the memory element or the resistor. Additionally, openings in regions where conductive layers are later provided are formed at this step (see FIG. 6A).

Next, an amorphous silicon layer is formed over the conductive layer 405d, the silicon electrode layer 404b, and the insulating layer 408. In addition, a silicon oxynitride layer is formed over the amorphous silicon layer. Note that a thin film deposition method such as a plasma CVD method or a sputtering method can be used for forming the amorphous silicon layer and the silicon oxynitride layer.

Next, a resist is selectively formed on the silicon oxynitride layer using a photolithography method. Further, the resist is used as a mask and the amorphous silicon layer and the silicon oxynitride layer are etched, so that amorphous silicon layers 410a and 410b and silicon oxynitride layers 411a and 411b are formed (see FIG. 6B).

Next, a conductive layer is formed over the insulating layer 408 and the silicon oxynitride layers 411a and 411b. The conductive layer can be formed using an elemental metal, an alloy, or a conductive material selected from a compound including a metal element. Note that a thin film deposition method such as a sputtering method can be used for forming the conductive layer.

Subsequently, a resist is selectively formed on the conductive layer using a photolithography method. The resist is used as a mask and the conductive layer is etched, so that conductive layers 412a, 412b, 412c, 412d, 412e, 412f, 412g, and 412h are formed (see FIG. 6C).

According to the above-described steps, the transistor 101, the capacitor 102 and the memory element 103 which are included in the memory circuit and the resistor 153 included in the flag circuit can be manufactured. Note that the above-described process is an example, and a manufacturing process of this embodiment is not limited to the above example.

The memory layer of the memory element and the resistive layer of the resistor included in the semiconductor device of this embodiment are formed of the same material. That is, the memory layer and the resistive layer can be formed in the same step. Consequently, the number of manufacturing steps of the semiconductor device can be reduced. As a result, the manufacturing yield of the semiconductor devices can be improved and the manufacturing cost of the semiconductor device can be reduced. In addition, the circuit area of the semiconductor device having the resistor can be reduced by formation of the resistor using a material having high resistance value used for the memory layer.

Note that the contents or a part of the contents of this embodiment can be combined with any of the contents or a part of the contents of the other embodiments or example as appropriate.

Embodiment 3

In this embodiment, an example of a semiconductor device having a memory element and a resistor is described with reference to FIG. 7. Specifically, a semiconductor device having a memory circuit and a reading circuit performing reading of information from the memory circuit is described.
<Memory Circuit and Reading Circuit>

Figure 7:
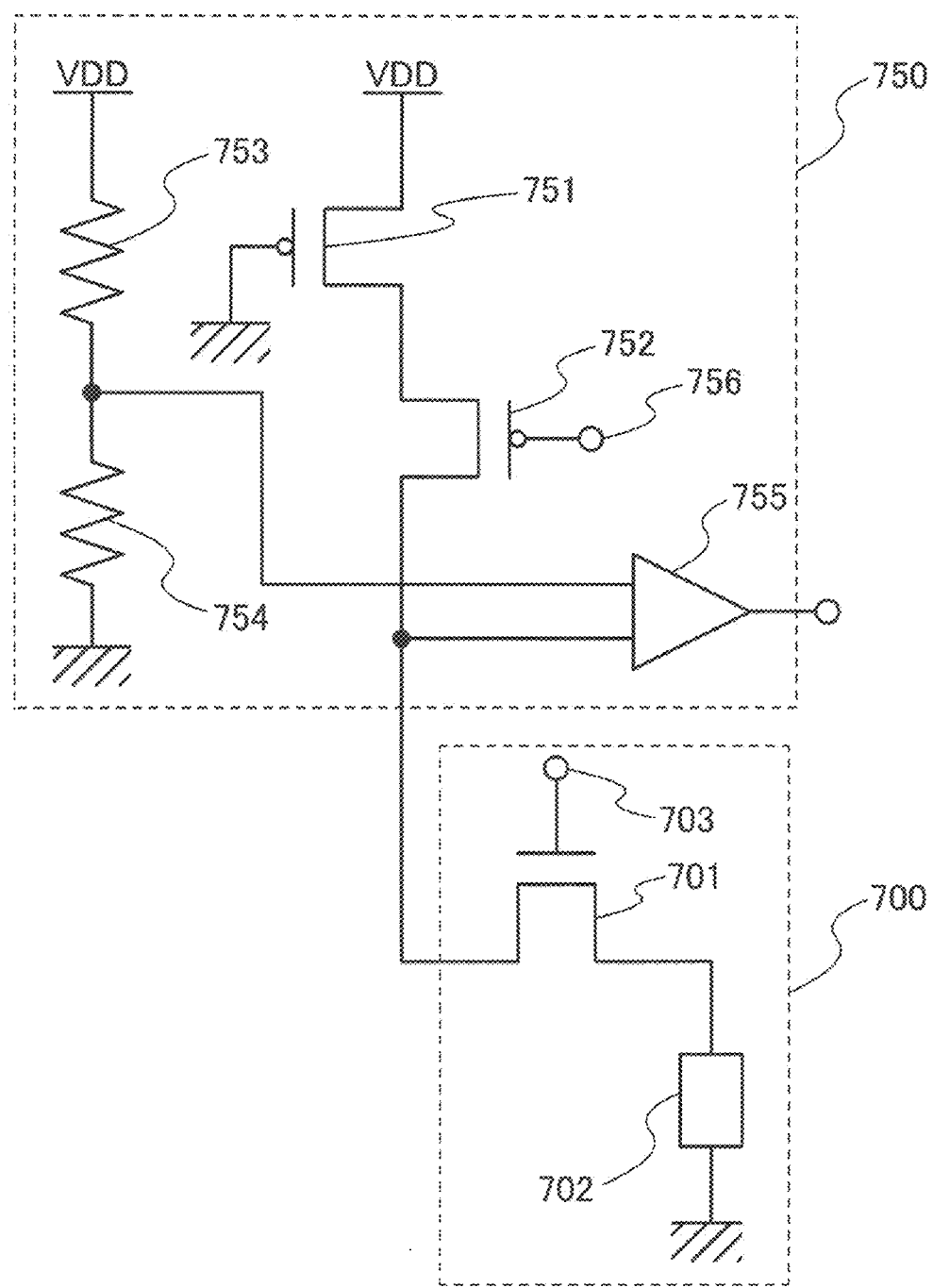
FIG. 7 is a circuit diagram of a reading circuit and a memory circuit which are included in a semiconductor device described in Embodiment 3.

FIG. 7 shows an example of a circuit configuration of a memory circuit and a reading circuit included in a semiconductor device of this embodiment.

A memory circuit 700 shown in FIG. 7 includes a transistor 701 and a memory element 702. Further, a gate electrode of the transistor 701 is electrically connected to a control terminal 703. One electrode of the memory element 702 is electrically connected to one electrode of the transistor 701, and the other thereof is grounded.

A reading circuit 750 shown in FIG. 7 has transistors 751 and 752, resistors 753 and 754, and a comparator 755. Further, a gate electrode of the transistor 751 is grounded. A first electrode of the transistor 751 is electrically connected to a wiring (also referred to as power supply line) to which a power supply voltage VDD is applied. A gate electrode, a first electrode, and a second electrode of the transistor 752 are electrically connected to a control terminal 756, a second electrode of the transistor 751, and the second electrode of the transistor 701 and a first input terminal of the comparator 755 respectively. One electrode of the resistor 753 and the other thereof are electrically connected to the power supply voltage wiring and a second input terminal of the comparator 755 respectively. One electrode of the resistor 754 is electrically connected to the other electrode of the resistor 753 and the second input terminal of the comparator 755, and the other thereof is grounded.

Note that the transistor 751, which is a p-channel transistor and a gate electrode thereof is grounded, is used not as a switching element but as a resistor. Therefore, the transistor 751 can be replaced with a resistor. In addition, a material of resistive layers of the resistors 753 and 754 is formed of the same material as the memory element 702. Note that the resistance value of the transistor 751 used as the resistor is designed to be between the resistance value of the memory element before writing and the resistance value of the memory element after writing.

When a reading signal is input to the circuit having the above-described configuration, signals are input from the control terminals 703 and 756 to the transistors 701 or 752 respectively, so that the transistors 701 and 752 are turned on. Accordingly, the power supply line is grounded through the transistor 751 and the memory element 702. Therefore, the power supply voltage VDD is divided by the transistor 751 and the memory element 702, and the divided potential is input to the first input terminal of the comparator 755. The potential divided by the resistors 753 and 754 is input to the second input terminal of the comparator 755. Here, since the resistors 753 and 754 are formed of the same material, approximately VDD/2 is input into the second input terminal of the comparator 755.

That is, in the state where data is not written to the memory element 702, the potential input to the first input terminal of the comparator 755 is higher than that input to the second input terminal of the comparator 755. In the state where data is written to the memory element 702, the potential input to the first input terminal of the comparator 755 is lower than that input to the second input terminal of the comparator 755. The comparator 755 compares the potential input to the first input terminal and the potential input to the second input terminal and outputs a signal carrying the binary value. Therefore, whether data is written to the memory element 702 or not can be identified by an output signal of the comparator 755.

In the semiconductor device of this embodiment, the power supply voltage VDD is lower than the writing voltage to the memory element 702. Therefore, resistive layers of the resistors 753 and 754 can be formed of the same material as a memory layer of the memory element 702. The memory layer may have any structure as long as it has a function of significantly increasing an electrical conduction property by application of a high voltage. For example, the stacked layer of an amorphous silicon layer and a silicon oxynitride layer described in Embodiment 2 can be applied. Alternatively, a single layer of an amorphous silicon layer or a silicon oxynitride layer may be applied. In addition, an organic compound can be used for a material for forming the memory layer.

The memory layer of the memory element and the resistive layer of the resistor included in the semiconductor device of this embodiment are formed of the same material. That is, the memory layer and the resistive layer can be formed in the same step. Consequently, the number of manufacturing steps of the semiconductor device can be reduced. As a result, the manufacturing yield of the semiconductor devices can be improved and the manufacturing cost of the semiconductor device can be reduced. In addition, the circuit area of the semiconductor device having the resistor can be reduced by formation of the resistor using a material having high resistance value used for the memory layer.

Note that the configuration of a reading circuit in this embodiment is not limited to the above-described configuration.

For example, the resistive layer of the resistor 753 or the resistor 754 can be formed of the same material as the memory layer of the memory element. In this case, the resistance value of the resistor 753 can be lowered than that of the resistor 754. When the resistance value of the resistor 753 becomes lower than that of the resistor 754, the potential input to the second input terminal of the comparator 755 becomes higher than the potential of VDD/2. Therefore, the transistor 751 can be omitted in the reading circuit 750. This is because in the case where data is written to the memory element 702, the potential of approximately VDD/2 is input to the first input terminal of the comparator 755 in the reading circuit in which the transistor 751 is omitted. In the case where data is not written to the memory element 702, the potential appropriately same as the power supply voltage VDD is input to the first input terminal of the comparator 755 in the reading circuit in which the transistor 751 is omitted. The transistor 751 is omitted, whereby time required to read information from the memory element 702 can be reduced.

In addition, the potential input to the second terminal of the comparator 755 becomes higher than the potential of VDD/2, so that the transistor 701 can be a p-channel transistor. In the case where the transistor 701 is a p-channel transistor, the electrode which is electrically connected to the first input terminal of the comparator 755 serves as a source electrode, and the electrode which is electrically connected to the memory element 702 serves as a drain electrode, in the transistor 701. Therefore, the input potential of the first input terminal of the comparator 755 does not become a potential which is obtained by resistance division of the power supply voltage VDD but becomes a potential which a threshold voltage of the transistor 701 is taken into account. In addition, the threshold voltage is approximately VDD/2 depending on the size of the transistor 701 and the like. That is in the case where the transistor 701 is an n-channel transistor, the range of the potential input to the first input terminal of the comparator 755 might be from the power supply voltage VDD to a ground potential. On the other hand, in the case where the transistor 701 is a p-channel transistor, the range of the potential input to the first input terminal of the comparator 755 might be from the power supply voltage VDD to VDD/2. In short, the transistor 701 is a p-channel transistor, the range of the potential input to the first input terminal of the comparator 755 is narrowed. Even in such a case, when the potential input to the second input terminal of the comparator 755 is higher than VDD/2, whether a signal is written to the memory element 702 or not can be identified. Note that since the transistor 701 is a p-channel transistor, the withstand voltage is improved and a gate insulating layer can be reduced in thickness. Thus, power consumption of the semiconductor device having the transistor 701 can be reduced.

Note that the contents or a part of the contents of this embodiment can be combined with any of the contents or a part of the contents of the other embodiments or example as appropriate.

Embodiment 4

In this embodiment, an example of a semiconductor device having a memory element and a resistor over the same substrate is described with reference to FIG. 8. Specifically, a semiconductor device having a memory circuit and a boosting circuit generating a high voltage capable of writing data to the memory element included in the memory circuit is described. Note that the boosting circuit has a limiter circuit portion. The limiter circuit is a circuit which functions in the case where an output voltage of the boosting circuit is too high, and controls the output voltage.

<Memory Circuit and Boosting Circuit>

FIG. 8 shows an example of a circuit configuration of the memory circuit and the boosting circuit included in the semiconductor device of this embodiment.

The memory circuit shown in FIG. 8 has the same configuration as the memory circuit shown in FIG. 7. Therefore, here, the description in Embodiments 3 is to be referred to.

A boosting circuit 800 shown in FIG. 8 includes a boosting portion 810 and a limiter circuit portion 820. An output terminal of the boosting portion 810 is electrically connected to a first electrode of the transistor 701. In addition, a boosting voltage VHH is output from the boosting portion 810. Note that the configuration of the boosting portion 810 is not limited to a certain configuration, and any configuration which can boost an input voltage may be used. For example, the boosting portion 810 can be formed using Dickson circuit. The limiter circuit portion 820 includes resistors 821, 822, 823, and 824 and a comparator 825. Further, an output terminal of the comparator 825 is electrically connected to an input terminal of the boosting portion 810. One electrode of the resistor 821 is electrically connected to the output terminal of the boosting portion 810 and the other thereof is electrically connected to a first input terminal of the comparator 825. One electrode of the resistor 822 is electrically connected to the other electrode of the resistor 821 and the first input terminal of the comparator 825, and the other thereof is grounded. One electrode of the resistor 823 is electrically connected to a power supply line and the other thereof is electrically connected to a second input terminal of the comparator 825. One electrode of the resistor 824 is electrically connected to the other electrode of the resistor 823 and the second input terminal of the comparator 825, and the other thereof is grounded.

Note that the boosting voltage VHH is a voltage boosted by the boosting portion 810 and higher than the power supply voltage VDD. Further, the resistance value of the resistor 821 is higher than that of the resistors 822, 823, and 824. The resistance values of the resistors 822, 823, and 824 are approximately the same. Specifically, the resistance value of the resistor 821 is 5 to 10 times as high as those of the resistors 822, 823, and 824.

When a writing signal is input to the above-described circuit, a voltage necessary for writing data to the memory element 702 (the boosting voltage VHH) is generated in the boosting circuit portion 810. Note that the boosting voltage VHH is input not only to the memory circuit 700 but also to the limiter circuit portion 820. Specifically, the boosting voltage VHH is input to one electrode of the resistor 821. Then, a voltage divided by the resistors 821 and 822 is input to the first input terminal of the comparator 825. Further, a voltage divided by the resistors 823 and 824 is input to the second terminal of the comparator 825. Note that the voltage input to the second input terminal of the comparator 825 is a constant value which is approximately VDD/2. The comparator 825 functions in the case where the boosting voltage VHH is too high, and can control the output of the boosting voltage VHH.

The power supply voltage VDD is lower than the writing voltage to the memory element 702 in the semiconductor device of this embodiment. Therefore, a resistive layer of the resistor 823 and the resistor 824 can be formed of the same material as the memory layer of the memory element 702.

The memory layer of the memory element and the resistive layer of the resistor in the semiconductor device of this embodiment are formed of the same material. That is, the memory layer and the resistive layer can be formed in the same step. Consequently, the number of manufacturing steps of the semiconductor device can be reduced. As a result, the manufacturing yield of the semiconductor devices can be improved and the manufacturing cost of the semiconductor device can be reduced. In addition, the circuit area of the semiconductor device having the resistor can be reduced by formation of the resistor using a material having high resistance value used for the memory layer.

Note that the configuration of the boosting circuit of this embodiment is not limited to the above-described configuration.

For example, in the case where the resistance value of the resistor 821 is higher than that of the resistor 822 and a voltage higher than or equal to the writing voltage to the memory element 702 is not applied to the resistor 822, a resistive layer of the resistor 822 can also be formed of the same material as the memory layer of the memory element 702.

In addition, as shown in Embodiment 2, in the case where the memory layer of the memory element 702 is a stacked layer of an amorphous silicon layer and a silicon oxynitride layer, and the electrode which is in contact with the amorphous silicon layer is a silicon electrode layer, a resistive layer of the resistor 821 can also be formed of the same material as the memory layer of the memory element 702. Note that the maximum value of a voltage applied to the resistor 821 needs to be a voltage required for dielectric breakdown of a stacked layer of the amorphous silicon layer and the silicon oxynitride layer or lower. In this manner, the manufacturing yield of the semiconductor devices can be further improved, the manufacturing cost can be further reduced, or the circuit area can further reduced by formation of the resistive layer of the resistor 821 or 822 with the use of the same material as the memory layer of the memory element 702.

Note that the contents or a part of the contents of this embodiment can be combined with any of the contents or a part of the contents of the other embodiments or example as appropriate.

Embodiment 5

In this embodiment, an example of a semiconductor device having a wireless communication function is described with reference to FIG. 9 and FIGS. 10A and 10B.

Figure 9:
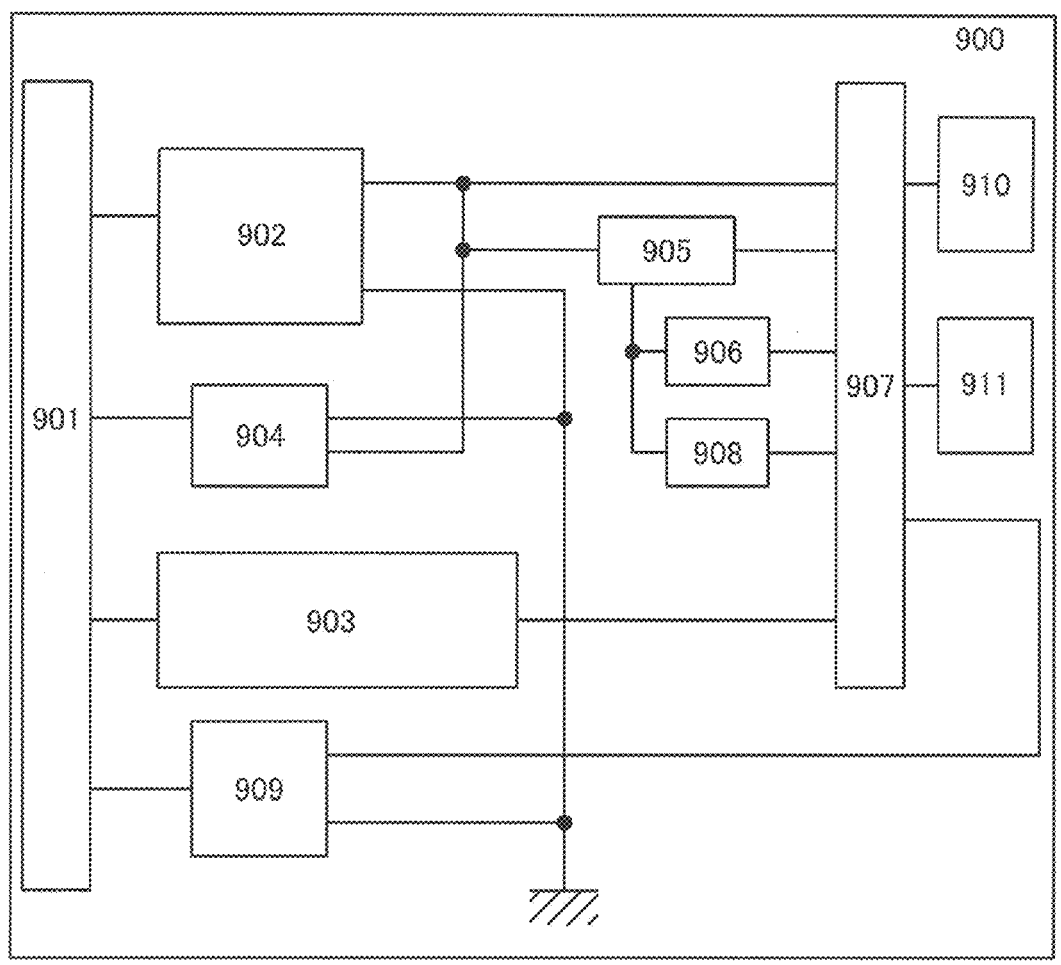
FIG. 9 shows a semiconductor device described in Embodiment 5.

FIG. 9 shows a block diagram of the configuration of a semiconductor device having a wireless communication function.

A semiconductor device 900 includes the following components: an antenna 901 generating an alternating voltage; a rectifier circuit 902 rectifying the alternating voltage and generating an internal voltage Vin; a demodulating circuit 903 demodulating a signal from the alternating voltage generated in the antenna 901, and generating an internal signal; a protection circuit 904 functioning in the case where the internal voltage Vin generated in the rectifier circuit 902 is high, and reducing signals input to the semiconductor device by changing resonant frequencies; a constant voltage circuit 905 making the internal voltage Vin generated in the rectifier circuit 902 to be a constant voltage and outputting it as a power supply voltage VDD; an oscillation circuit 906 generating a clock signal CLK using the power supply voltage VDD generated in the constant voltage circuit 905; a logic circuit 907 analyzing a signal using the power supply voltage VDD generated in the constant voltage circuit 905, the clock signal CLK generated in the oscillation circuit 906, and a demodulating signal generated in the demodulating circuit 903, and generating a response signal; a reset circuit 908 generating an initialization signal of the logic circuit 907 by utilizing rise of the power supply voltage VDD; a modulation circuit 909 modulating a signal from the logic circuit 907 and outputting the modulation signal to the antenna 901; and a memory circuit 910 and a flag circuit 911 exchanging information with the logic circuit 907.

Figure 10A:
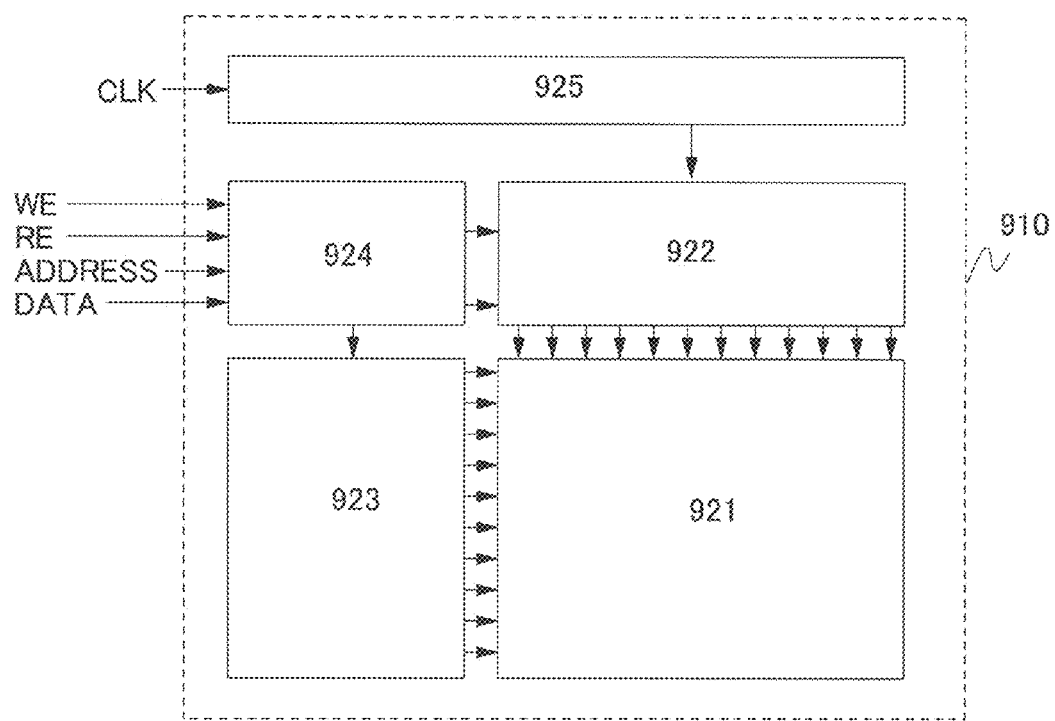
FIGS. 10A and 10B show a semiconductor device described in Embodiment 5.

FIG. 10A shows a block diagram of the configuration of the memory circuit 910. The memory circuit 910 shown in FIG. 10A includes a memory cell array 921, a column decoder 922, a row decoder 923, an interface 924, a boosting circuit 925, and the like.

Figure 10B:
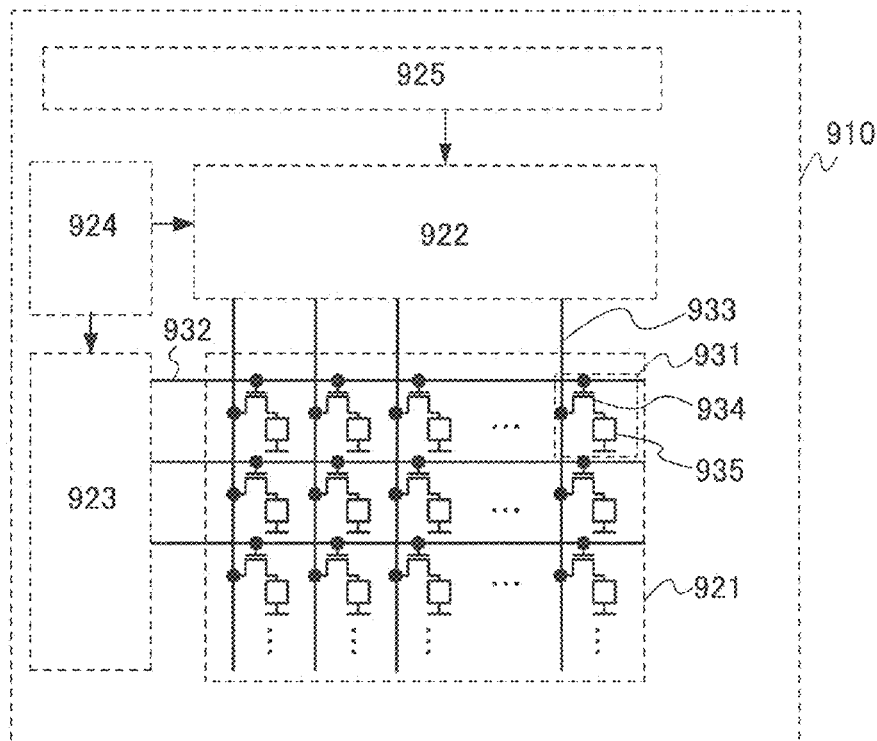

Further, FIG. 10B shows a specific example of the circuit configuration of the memory cell array 921 included in the memory circuit shown in FIG. 10A. The memory cell array 921 includes a plurality of memory cells 931 arranged in m rows and n columns, an in number of word lines 932, and an n number of bit lines 933 (both m and n are natural numbers). The memory cell 931 arranged in i-th row and j-th column includes a transistor 934, a gate electrode of which is electrically connected to the i-th word line and a first electrode of which is electrically connected to the j-th bit line, and the memory element 935 one electrode of which is electrically connected to a second electrode of the transistor 934 and the other of which is electrically connected to a fixed potential line (i is a natural number of m or less, and j is a natural number of n or less). Note that in this embodiment, a ground potential is applied to the fixed potential line. Moreover, a capacitor may be provided in parallel to the memory element 935. Accordingly, yield of writing (the probability of success in writing data) to the memory element 935 can be improved.

A writing signal (WE), a reading signal (RE), an address signal (ADDRESS), a data signal (DATA), and the like are applied from the external to the interface 924 in the memory circuit 910 of this embodiment. These external signals are input to the column decoder 922 and the row decoder 923 through the interface 924. The column decoder 922 and the row decoder 923 each control potentials of a plurality of word lines and a plurality of bit lines according to the input signals. Specifically, on and off of the transistor 934 provided in each of the memory cells 931 are controlled by the low decoder 923. Information is written to or read from the memory element 935 provided in each of the memory cells 931 by the column decoder 922.

An operation in which information is written to the memory cell 931 arranged in i-th row and j-th column is described below. First, the transistor included in the memory cell arranged in i-th row is turned on by the row decoder 923. Further, a potential of the j-th bit line rises by the column decoder 922. Note that the potential applied to the j-th bit line is the boosting voltage VHH which is boosted in the boosting circuit 925 capable of writing data to the memory element 935. Therefore, a high voltage is applied to the memory element 935 included in the memory cell 931 arranged in i-th row and j-th column and the resistance value changes significantly. This significant change in the resistance value of the memory element 935 corresponds to performance of writing information.

In addition, information can be read from the memory cell 931 arranged in i-th row and j-th column using the method described in Embodiment 3. That is, whether information is written to the memory element 931 arranged in i-th row and j-th column or not can be identified by formation of a voltage divider circuit including the memory element 935 arranged in the i-th row and j-th column as a component, and identification of an output signal of the voltage divider circuit.

The semiconductor device of this embodiment includes the memory circuit, the flag circuit, the reading circuit, and the boosting circuit shown in any of the above embodiments. The memory circuit includes a memory element. At least one of the flag circuit, the reading circuit and the boosting circuit includes a resistor in which a layer forming a memory layer of the memory element serves as a resistive layer. The memory element and the resistor in the semiconductor device of this embodiment are formed in the same step. Consequently, the number of manufacturing steps of the semiconductor device can be reduced. As a result, the manufacturing yield of the semiconductor devices can be improved and the manufacturing cost of the semiconductor device can be reduced. In addition, the circuit area of the semiconductor device having the resistor can be reduced by formation of the resistor using a material having high resistance value used for the memory layer.

Note that the contents or a part of the contents of this embodiment can be combined with any of the contents or a part of the contents of the other embodiments or example as appropriate.

Embodiment 6

In this embodiment, specific examples of a semiconductor device having a wireless communication function are described with reference to FIGS. 11A and 11B, FIGS. 12A and 12B, and FIGS. 13A to 13C.

Figure 11A:
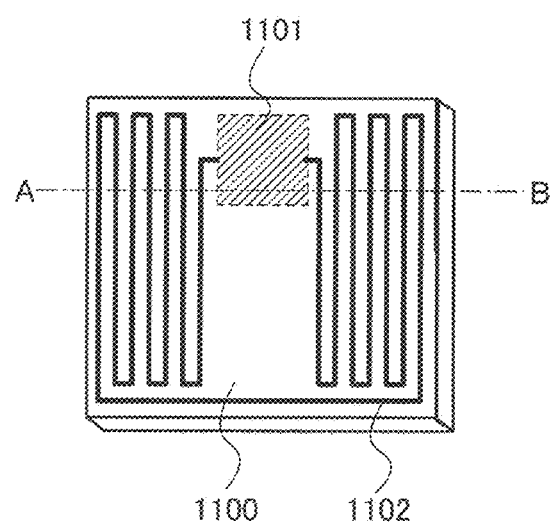
FIGS. 11A and 11B show a semiconductor device described in Embodiment 6.

The semiconductor device shown in FIG. 11A has a substrate 1100, an element portion 1101 which is formed over the substrate 1100, and an antenna 1102 which is electrically connected to the element portion 1101.

The element portion 1101 includes a plurality of elements such as a memory element and a resistor, and has a function of processing a signal received from the external. The antenna 1102 has a function of transmitting data in the semiconductor device.

Figure 11B:
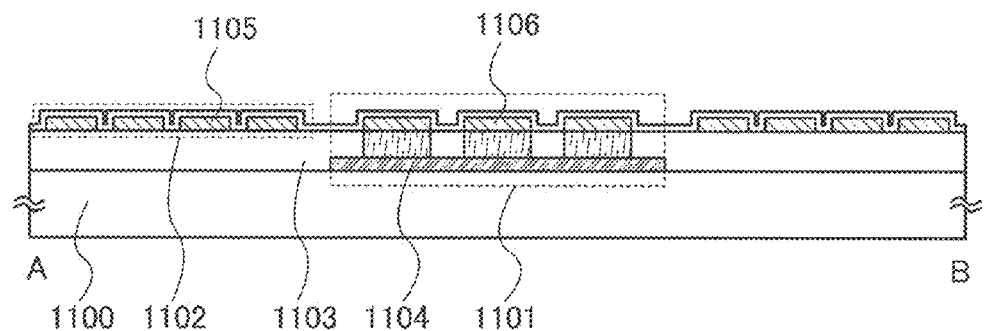

FIG. 11B shows a cross-sectional view taken along line A-B of the semiconductor device shown in FIG. 11A. The semiconductor device includes an element layer 1104 formed over the substrate 1100, an insulating layer 1103 formed over the substrate 1100 and the element layer 1104, a conductive layer 1105 functioning as the antenna 1102 formed over the insulating layer 1103, and a conductive layer 1106 connected to the element layer 1104.

Note that in the structure of FIG. 11B, the conductive layer 1105 functioning as the antenna 1102 and the conductive layer 1106 are provided over the same layer; however, the conductive layer 1105 and the conductive layer 1106 can be formed over different layers. That is, after the element portion 1101 is provided, an insulating layer is separately provided so as to cover the element portion 1101 and the conductive layer 1105 is provided over the insulating layer.

Note that the structure of the semiconductor device having a wireless communication function is not limited to the structure of FIGS. 11A and 11B. Another structural example of the semiconductor device is described with reference to FIGS. 12A and 12B.

Figure 12A:
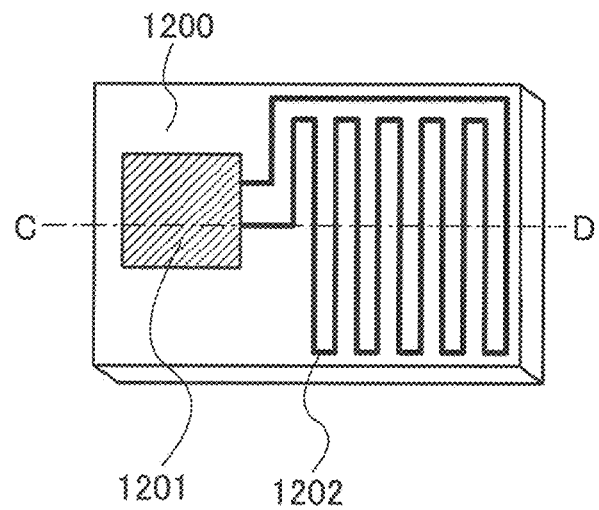
FIGS. 12A and 12B show a semiconductor device described in Embodiment 6.

The semiconductor device shown in FIG. 12A has a substrate 1200, an element portion 1201 formed over the substrate 1200, and an antenna 1202 electrically connected to the element portion 1201.

Similarly to the structure shown in FIGS. 11A and 11B, the element portion 1201 includes a plurality of elements such as a memory element and a resistor and has a function of processing a signal received from the external. The antenna 1202 has a function of transmitting data in the semiconductor device.

Figure 12B:
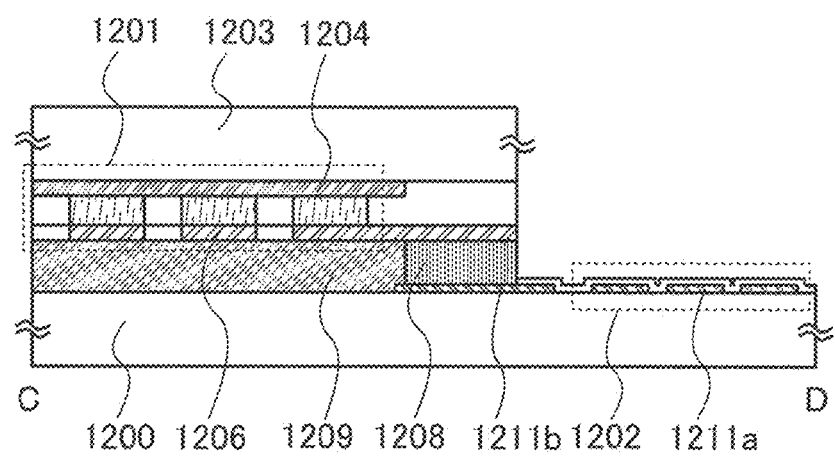

FIG. 12B shows a cross-sectional view taken along line C-D of the semiconductor device shown in FIG. 12A. The semiconductor device includes the substrate 1200, a conductive layer 1211a which serve as the antenna 1202 and a resin 1209 provided over the substrate 1200, a layer 1208 containing conductive particles formed over a conductive layer 1211b, a conductive layer 1206 formed over the resin 1209 and the layer 1208 containing the conductive particles, the element portion 1201 having an element layer 1204 formed over the conductive layer 1206, and a substrate 1203 formed over the element portion 1201.

In the case of the structure of FIGS. 12A and 12B, the conductive layer 1206 which functions as a terminal portion is provided over the substrate 1203. The substrate 1203 over which the element layer 1204 and the conductive layer 1206 are provided and the substrate 1200 over which the antenna 1202 is provided are attached to each other by the resin 1209 so as to connect the conductive layers 1206 and 1211b electrically through the layer 1208 containing the conductive particles.

In this embodiment, a memory layer of the memory element and a resistive layer of the resistor included in the element portion 1101 of FIGS. 11A and 11B and the element portion 1201 of FIGS. 12A and 12B can be formed of the same material, as described in the above embodiments. That is, the memory element and the resistor can be formed in the same step. Consequently, the number of manufacturing steps of the semiconductor device can be reduced. As a result, the manufacturing yield of the semiconductor devices can be improved and the manufacturing cost of the semiconductor device can be reduced. In addition, the circuit area of the semiconductor device having the resistor can be reduced by forming the resistor using a material having high resistance value used for the memory layer.

Further, the manufacturing cost of the element portion 1101 of FIGS. 11A and 11B and the element portion 1201 of FIGS. 12A and 12B can be reduced by formation of a plurality of element portions on a substrate having a large area in advance and division thereof. As the substrate 1100 in FIGS. 11A and 11B and the substrates 1200 and 1203 in FIGS. 12A and 12B used here, the following substrate can be used: a glass substrate, a quartz substrate, a ceramic substrate, a metal substrate (e.g., a stainless steel substrate), a semiconductor substrate (e.g., a silicon substrate), or the like. Alternatively, a flexible substrate or the like formed using polyethylene terephthalate (PET), polyethylene naphthalate (PEN), polyether sulfone (PES), acrylic, or the like can be used as a plastic substrate.

Note that a plurality of transistors, memory elements, and resistors included in the element portion 1101 in FIGS. 11A and 11B and the element portion 1201 in FIGS. 12A and 12B are not necessary needed to be formed over the same layer. The elements can be formed over different layers. When the element portion 1101 in FIGS. 11A and 11B and the element portion 1201 in FIGS. 12A and 12B are formed over different layers, an interlayer insulating layer is formed. As a material of the interlayer insulating layer, a resin material such as an epoxy resin or an acrylic resin, a light-transmitting resin material such as a polyimide resin, a compound material which includes a siloxane material such as a siloxane resin, a material which contains a water-soluble homopolymer and a water-soluble copolymer, or an inorganic material can be used. A stacked-layer structure formed selecting the above materials can also be used. The siloxane material corresponds to a material having a Si—O—Si bond. Siloxane includes a skeleton formed from a bond of silicon (Si) and oxygen (O). An organic group (e.g., an alkyl group or an aryl group) or a fluoro group may be used as a substituent. The organic group may contain a fluoro group. Note that the interlayer insulating layer can be formed by a CVD method, a sputtering method, an SOG method, a droplet discharge method, a screen printing method, or the like.

Moreover, as a material of the interlayer insulating layer, a material with low dielectric constant is preferably used for reducing parasitic capacitance which is generated between the layers. When the parasitic capacitance is reduced, a high speed operation of the semiconductor device and reduction in power consumption thereof can be realized.

The conductive layers 1105 and 1106 in FIG. 11B and the conductive layers 1206, 1211a and 1211b in FIG. 12B can be formed using a CVD method, a sputtering method, a printing method such as a screen printing method or a gravure printing method, a droplet discharge method, a dispenser method, a plating method, or the like. In addition, for the conductive layers 1105 and 1106 in FIGS. 11A and 11B and the conductive layers 1206, 1211a and 1211b in FIGS. 12A and 12B, the following material can be used: an alloy material or a compound material including an element selected from aluminum (Al), titanium (Ti), silver (Ag), copper (Cu), gold (Au), platinum (Pt), nickel (Ni), palladium (Pd), tantalum (Ta), or molybdenum (Mo) as a main component. Further, these conductive layers can be formed with a single-layer structure or a stacked-layer structure.

For example, in the case of forming the conductive layers 1105 and 1106 in FIG. 11B and the conductive layers 1211a and 1211b in FIG. 12B by a screen printing method, the conductive layers 1105 and 1106 in FIG. 11B and the conductive layers 1211a and 1211b in FIG. 12B can be formed by selectively printing a conductive paste where conductive particles having a grain diameter of several nanometers to several tens micrometers are dissolved or dispersed in an organic resin. As the conductive particle, one or more metal particles selected from silver (Ag), gold (Au), copper (Cu), nickel (Ni), platinum (Pt), palladium (Pd), tantalum (Ta), molybdenum (Mo), titanium (Ti), and the like; a fine particle of silver halide; or a dispersive nanoparticle can be used. In addition, as the organic resin included in the conductive paste, one or more selected from organic resins functioning as a binder of metal particles, a solvent, a dispersing agent and a coating material can be used. Typically, organic resins such as an epoxy resin or a silicone resin can be given. Further, in forming the conductive layer, baking is preferably performed after the conductive paste is pushed out. For example, in the ease of using a fine particle which includes silver as its main component (e.g., a particle size is from 1 nm to 100 nm) as a material for the conductive paste, the conductive layer can be obtained by baking it with temperatures in the range of 150° C. to 300° C. for curing. Alternatively, a fine particle which includes solder or lead-free solder as its main component may be used as a fine particle. In this case, it is preferable that a fine particle having a grain diameter of 20 μm or less be used. By using solder or lead-free solder, the conductive layers can be formed at low cost.

FIGS. 11A and 11B and FIGS. 12A and 12B show examples of the structures of the semiconductor device in which a substrate provided with element portion is used as it is; however, the structure of the semiconductor device is not limited thereto. An example in which a semiconductor device is manufactured using a different substrate from the substrate provided with an element portion is described with reference to FIGS. 13A to 13C.

Figure 13A:
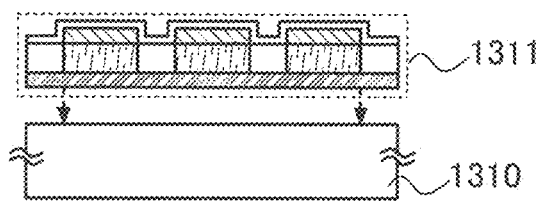
FIGS. 13A to 13C show a semiconductor device described in Embodiment 6.
Figure 13B:
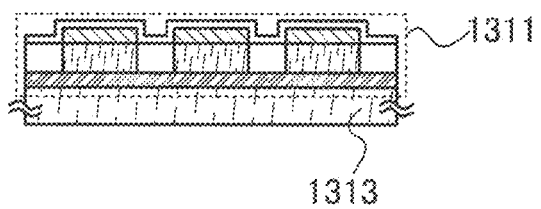

As shown in FIG. 13A, in a substrate 1310 over which an element portion 1311 is formed, the element portion 1311 over the substrate 1310 is separated. Further, as shown in FIG. 13B, the separated element portion 1311 can be attached to a substrate 1313 which is different from the substrate 1310. Note that as the substrate 1313, a flexible substrate or the like can be used, for example.

The element portion 1311 can be separated from the substrate 1310 by any of the following methods: a method in which a metal oxide layer is provided between the substrate 1310 with high heat resistance and the element portion 1311 and the metal oxide layer is crystallized to be weakened so that the element portion 1311 is separated; a method in which an amorphous silicon layer containing hydrogen is provided between the substrate 1310 with high heat resistance and the element portion 1311 and the amorphous silicon layer is removed by laser light irradiation or etching so that the element portion 1311 is separated; a method in which the substrate 1310 with high heat resistance, over which the element portion 1311 is formed, is removed mechanically or by etching with a solution or a gas such as $CF_3$ so that the element portion 1311 is separated; and the like.

In addition to the methods described above, a metal layer (for example, tungsten (W), molybdenum (Mo), titanium (Ti), tantalum (Ta), or cobalt (Co)), a metal oxide layer (for example, tungsten oxide, molybdenum oxide, titanium oxide, tantalum oxide, or cobalt oxide), or a stacked-layer structure of a metal layer and a metal oxide layer, which serves as a separation layer, may be provided between the substrate 1310 and the element portion 1311, whereby the substrate 1310 and the element portion 1311 can be separated from each other by a physical means. Alternatively, after an opening portion is selectively formed so that the separation layer is exposed, a part of the separation layer is removed with an etching agent such as halogen fluoride (e.g., $ClF_3$), and then, the element portion 1311 can be separated from the substrate 1310 physically.

Further, the separated element portion 1311 may be attached to the substrate 1313 by using a commercialized adhesive, for example, an adhesive such as an epoxy resin-based adhesive or a resin additive.

Figure 13C:
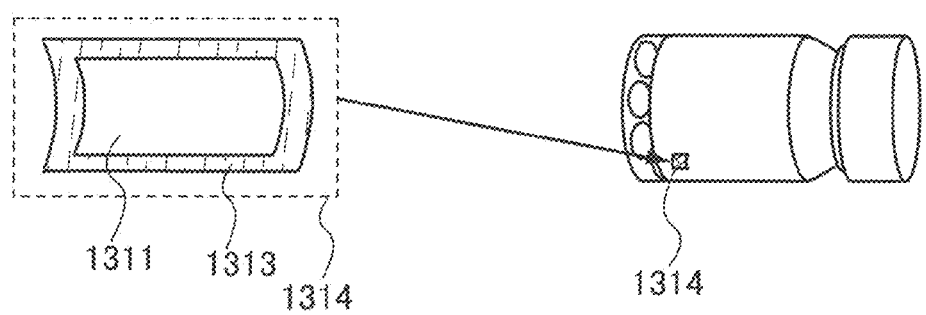

When the element portion 1311 is attached to the substrate 1313 so that the semiconductor device is manufactured as described above, a semiconductor device which is thin, lightweight, and is not easily broken even when it is dropped can be provided. Further, if a flexible substrate is used as the substrate 1313, the semiconductor device can be attached to a curved surface or an irregular shape, whereby a variety of applications are realized. For example, as shown in FIG. 13C, a semiconductor device 1314 can be tightly attached to a curved surface of a medicine bottle. Furthermore, the manufacturing cost of the semiconductor device can be reduced by reuse of the substrate 1310.

Note that the contents or a part of the contents of this embodiment can be combined with any of the contents or a part of the contents of the other embodiments or example as appropriate.

Embodiment 7

In this embodiment, an example of a structure of a semiconductor device having flexibility is described with reference to FIGS. 14A to 14C.

Figure 14A:
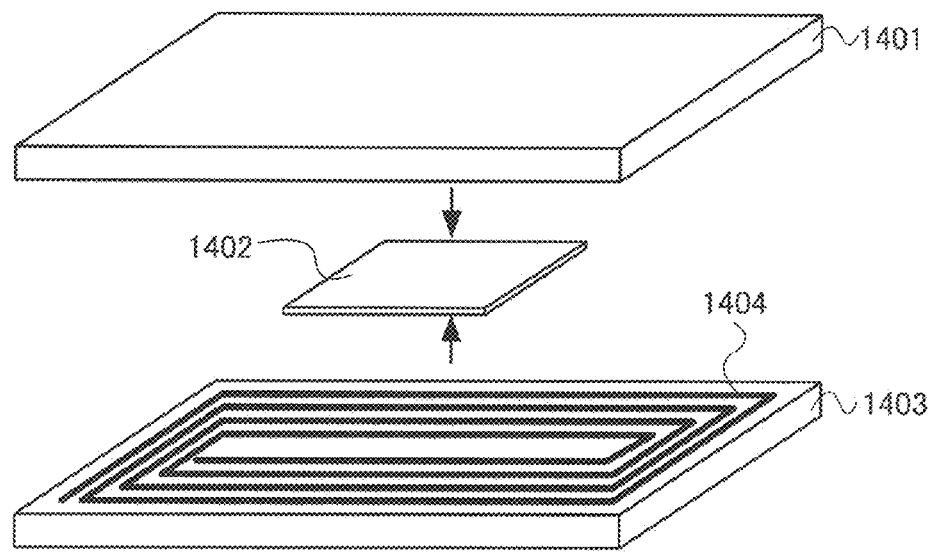
FIGS. 14A to 14C show a semiconductor device described in Embodiment 7.

A semiconductor device shown in FIG. 14A is manufactured in such a manner that a protective layer 1401 which has flexibility and a protective layer 1403 which has flexibility and for which an antenna 1404 is provided are bonded to each other with an element portion 1402 formed in a separation process interposed therebetween. The antenna 1404 which is formed over the protective layer 1403 is electrically connected to the element portion 1402. The antenna 1404 is formed only over the protective layer 1403 in FIGS. 14A and 14B; however, the antenna 1404 can also be formed over the protective layer 1401. In addition, when a barrier layer formed of a silicon nitride layer or the like is formed between the element portion 1402, and the protective layers 1401 and 1403, a semiconductor device having higher reliability can be provided, without contamination of the element portion 1402.

The element portion 1402 and the antenna 1404 can be electrically connected by performing UV treatment or ultrasonic treatment using an anisotropic conductive layer. Note that a method for connecting the element portion 1402 and the antenna 1404 is not limited thereto, and various methods can be used.

Figure 14B:
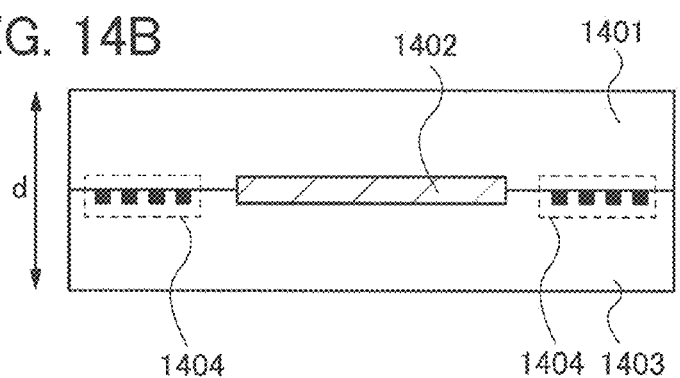

FIG. 14B shows a cross-sectional view of the semiconductor device shown in FIG. 14A. The thickness of the element portion 1402 which is interposed between the protective layers 1401 and 1403 may be 5 μm or less, preferably 0.1 to 3 μm. In addition, when the thickness of a stack of the protective layers 1401 and 1403 is d, the thickness of the protective layer 1401 and that of protective layer 1403 are each preferably in the range of from (d/2)+30 μm to (d/2)−30 μm, more preferably in the range of from (d/2)+10 μm to (d/2)−10 μm. Further, it is preferable that each of the protective layer 1401 and the protective layer 1403 have a thickness of 10 μm to 200 μm. Furthermore, the area of the element portion 1402 is 5 mm×5 mm (25 mm$^2$) or less, preferably 0.3 mm×0.3 mm (0.09 mm$^2$) to 4 mm×4 mm (16 mm$^2$).

Each of the protective layer 1401 and the protective layer 1403 is made of an organic resin material, and thus has high resistance against bending. Further, the element portion 1402 formed in the separation process itself also has high resistance against bending. Since the element portion 1402 and the protective layers 1401 and 1403 can be tightly attached to each other without any space, a completed semiconductor device itself also has high resistance against bending. The element portion 1402 which is sandwiched by the protective layers 1401 and 1403 may be provided over a surface of or inside another object, or may be embedded in paper.

Next, the case where the element portion which is formed through the separation process is attached to a substrate having a curved surface is described.

Figure 14C:
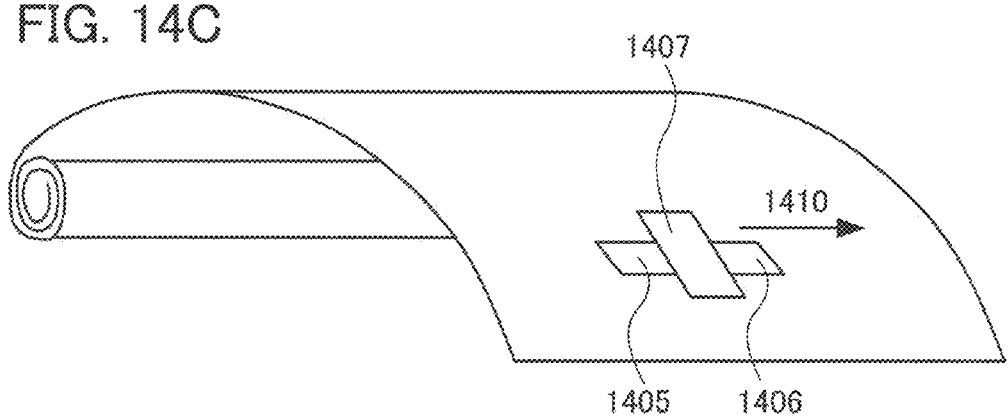

As shown in FIG. 14C, one transistor in the element portion formed through the separation process includes a first electrode 1405, a second electrode 1406, and a gate electrode 1407. In addition, the direction 1410 where current flows and a direction where a substrate draws an arc are arranged to be perpendicular to each other. With such arrangement, even when the substrate is bent to draw an arc, the influence of stress on the transistor is small, and variations in characteristics of transistors included in the element portion 1402 can be suppressed.

Further, when the proportion of the area in which transistors are present in the whole area of the element portion 1402 is 1% to 50% (more preferably 1% to 30%), destruction of the elements due to stress can be prevented.

Note that the contents or a part of the contents of this embodiment can be combined with any of the contents or a part of the contents of the other embodiments or example as appropriate.

Embodiment 8

In this embodiment, usage examples of a semiconductor device are described with reference to FIGS. 15A to 15F.

As shown in FIGS. 15A to 15F, the semiconductor device is widely used by being provided in, for example, bills, coins, securities, bearer bonds, documents (such as driver's licenses or resident's cards, see FIG. 15A), storage media (such as DVD software or video tapes, see FIG. 15B), packaging containers (such as wrapping paper or bottles, see FIG. 15C), vehicles (such as bicycles, see FIG. 15D), personal belongings (such as bags or pairs of glasses), foods, plants, animals, human bodies, clothing, everyday articles or products such as electronic appliances (liquid crystal display devices, EL display devices, television receivers, or mobile phones), tags on products (see FIGS. 15E and 15F), or the like.

A semiconductor device 1500 is fixed to an object by being mounted on a printed board, being attached to a surface, or being embedded in the object. For example, the semiconductor device 1500 is embedded in paper of a book or an organic resin package to be fixed to each object. As the semiconductor device 1500 achieve a small size, a low profile, and light weight, the design of an object is not impaired even after the semiconductor device 1500 is fixed to the object. Further, by providing the semiconductor device 1500 for bills, coins, securities, bearer bonds, documents, and the like, an identification function can be obtained and forgery thereof can be prevented by utilizing the identification function. Further, when the semiconductor device 1500 is attached to containers for wrapping objects, storage media, personal belongings, foods, clothes, everyday articles, electronic devices, or the like, a system such as an inspection system can be efficiently used. In addition, even for a vehicle, the level of security against theft or the like can be raised when the semiconductor device 1500 is provided with the vehicle.

When a semiconductor device described in the above embodiments is used for application usage given in this embodiment in this manner, data which is used for exchanging information can be maintained at an accurate value. Therefore, authenticity or security of an object can be increased.

Note that the contents or a part of the contents of this embodiment can be combined with any of the contents or a part of the contents of the other embodiments or example as appropriate.

EXAMPLE 1

In this example, a manufacturing method of a semiconductor device having a p-channel transistor and an n-channel transistor included in a logic circuit, a memory element and a capacitor connected to the memory element in parallel included in a memory circuit, a resistor and a capacitor connected to the resistor in parallel included in a flag circuit, and an antenna is described with reference to FIGS. 16A to 16E, FIGS. 17A to 17E, FIGS. 18A to 18E, FIGS. 19A to 19D, and FIGS. 20A to 20C.

First, a metal layer 1502 which serves as a separation layer is formed over a supporting substrate 1501.

In this embodiment, a glass substrate is used as the supporting substrate 1501, and a tungsten layer having a thickness of 30 nm is used as the metal layer 1502 (see FIG. 16A).

Next, an insulating layer 1503 is formed over the metal layer 1502. In this example, a stacked layer of a silicon nitride oxide layer having a thickness of 50 nm and a silicon oxynitride layer having a thickness of 100 nm is used as the insulating layer 1503 (see FIG. 16B).

Then, a semiconductor layer 1570 is formed over the insulating layer 1503. In this example, an amorphous silicon layer having a thickness of 66 nm is formed over the insulating layer 1503. Further, a polycrystalline silicon layer crystallized by laser irradiation is used as the semiconductor layer 1570 (see FIG. 16C).

Note that if necessary, an impurity element (boron or phosphorus) may be slightly added to the semiconductor layer 1570 in order to control the threshold voltage of a thin film transistor to be completed later. In this embodiment, boron (B) is added to the semiconductor layer 1570 by an ion doping method by which diborane ($B_2H_6$) is not mass-separated but excited by plasma (see FIG. 16D).

Next, the semiconductor layer 1570 is selectively etched so that semiconductor layers 1571 to 1574 having desired shapes are formed (see FIG. 16E).

In addition, in order to form a channel region, an impurity element may be added to semiconductor layers including a region which serve as a n-channel transistor at a low concentration. In this example, the semiconductor layer 1571 in a region which serves as a p-channel transistor is covered with a resist mask 1577, and boron (B) is added to the semiconductor layers 1572 to 1574 including the region which serve as the n-channel transistor (see FIG. 17A).

Next, an insulating layer 1578 covering the semiconductor layers 1571 to 1574 is formed. In this example, a silicon oxynitride layer having a thickness of 20 nm is used as the insulating layer 1578 (see FIG. 17B).

Next, in order to make the semiconductor layers 1573 and 1574 formed in regions which serve as capacitors later function as silicon electrode layers, an impurity element (boron or phosphorus) is added to the semiconductor layers at a high concentration. At this time, an impurity element imparting p-type conductivity is preferably added to a region which is used as an assist capacitor in a memory cell. Note that the semiconductor layers 1571 and 1572 formed in regions which serve as the transistors may be covered with a resist mask 1579. In this example, the impurity element is added to the semiconductor layers 1573 and 1574 which serves as the silicon electrode layers so as to be contained at a concentration of $1 \times 10^{18}$ (atoms/cm$^3$) to $1 \times 10^{19}$ (atoms/cm$^3$), whereby the silicon electrode layer is formed (see FIG. 17C).

Next, a conductive layer is formed over the insulating layer 1578. In this example, a stacked layer of a tantalum nitride layer having a thickness of 30 nm and a tungsten layer having a thickness of 370 nm is used as the conductive layer. Further, the conductive layer is selectively etched so that conductive layers 1504 to 1507 having desired shapes are formed (see FIG. 17D).

Next, resist masks 1582 to 1584 are formed so as to cover the semiconductor layer 1571 in the region which serves as the p-channel transistor and the semiconductor layers 1573 and 1574 in the regions which serve as the capacitors. After that, an impurity element is added to the semiconductor layer 1572 which serves as the n-channel transistor by using the conductive layer 1505 as a mask, so that an impurity region is formed. In this example, phosphorus (P) is added to the semiconductor layer 1572 which serves as the n-channel transistor so as to be contained at a concentration of $1\times10^{15}$ (atoms/cm$^3$) to $1\times10^{19}$ (atoms/cm$^3$), so that n-type impurity region is formed (see FIG. 17E).

Next, a resist mask 1585 is formed so as to cover the semiconductor layer 1572 formed in the region which serves as the n-channel transistor. After that, an impurity element is added to the semiconductor layer 1571 in the region which serves as the p-channel transistor by using the conductive layer 1504 as a mask, so that p-type impurity region is formed. At the same time, an impurity element is added to the semiconductor layers 1573 and 1574 in the regions which serve as the capacitors, so that p-type impurity regions are formed. In this example, boron (B) is added to the semiconductor layer 1571 which serves as the p-channel transistor so as to be contained at a concentration of $1\times10^{19}$ (atoms/cm$^3$) to $1\times10^{20}$ (atoms/cm$^3$), whereby a p-type impurity region is formed. As a result, a channel formation region 1513 and a pair of p-type impurity regions 1514a and 1514b are formed in the semiconductor layer 1571 in a region which serves as a p-channel transistor in a self-aligned manner. The p-type impurity regions 1514a and 1514b function as a drain region and a source region of a p-channel transistor. In the same manner, p-type impurity regions 1515 and 1516 having different impurity concentrations are formed in a self-aligning manner in the semiconductor layers 1573 and 1574 in the regions which serve as the capacitors (see FIG. 18A).

Next, an insulating layer 1588 is formed so as to cover the insulating layer 1578 and the conductive layers 1504 to 1507. In this example, a stacked layer of a silicon oxynitride layer having a thickness of 100 nm and a low temperature oxide (LTO) layer having a thickness of 200 nm is used as the insulating layer 1588 (see FIG. 18B). Next, the insulating layer 1588 is selectively etched so that sidewalls 1510 which are in contact with side surface of the conductive layers 1504 to 1507 are formed. In addition, a part of the insulating layer 1578 is removed by being etched at the same time as the formation of the sidewalls 1510. The insulating layer 1512 remains below the conductive layers 1504 to 1507 and the sidewalls 1510 by removing a part of the insulating layer 1578 (see FIG. 18C).

Next, resist masks 1589 to 1591 are formed so as to cover the semiconductor layer 1571 in the region which serves as the p-channel transistor and the semiconductor layers 1573 and 1574 in the regions which serve as the capacitors. After that, an impurity element is added to the semiconductor layers 1572 formed in the region which serves as the n-channel transistor by using the conductive layer 1505 and the sidewalls 1510 as masks, so that high-concentration impurity regions are formed. In this example, phosphorus (P) is added to the semiconductor layer 1572 in the region which serves as the n-channel transistor so as to be contained at a concentration of $1\times10^{19}$ (atoms/cm$^3$) to $1\times10^{20}$ (atoms/cm$^3$), so that n-type high-concentration impurity region is formed. As a result, a channel formation region 1520, a pair of low-concentration impurity regions 1519a and 1519b which serves as LDD regions, and a pair of high-concentration impurity regions 1518a and 1518b which serve as a source region and a drain region are formed in the semiconductor layer 1572 in the region which serves as the n-channel transistor in a self-aligning manner. Note that low-concentration impurity regions 1519a and 1519b which function as LDD regions are formed below the sidewalls 1510 (see FIG. 18D).

Note that here although the structure is described in which the LDD regions are formed in the semiconductor layer 1572 in the region which serves as the n-channel transistor and LDD regions are not formed in the semiconductor layer 1571 in the region which serves as the p-channel transistor, the structure is not limited to this as a matter of course. The LDD regions may be formed in the semiconductor layers included in both the n-channel transistor and the p-channel transistor.

Next, an insulating layer 1522 containing hydrogen is formed so as to cover the semiconductor layer 1571 to 1574 and the conductive layers 1504 to 1507. In this example, a silicon oxynitride layer having a thickness of 50 nm is used as the insulating layer 1522 (see FIG. 18E).

Next, an insulating layer 1523 covering the insulating layer 1522 is formed. In this example, a stacked layer of a silicon nitride oxide layer having a thickness of 100 nm and a silicon oxynitride layer having a thickness of 600 nm is used as the insulating layer 1523 (see FIG. 19A).

Next, the insulating layers 1522 and 1523 are selectively etched, so that openings 1524 and 1525 reaching the conductive layers 1506 and 1507 are formed. In this example, the diameter of the openings 1524 and 1525 is 2 μm (see FIG. 19B).

Next, a memory layer 1526 and a resistive layer 1527 are formed. In this example, the memory layer 1526 and the resistive layer 1527 are formed in the following manner: forming a layer in which a silicon oxynitride layer having a thickness of 6 nm and an amorphous silicon layer having a thickness of 15 nm are stacked in this order is formed using a plasma CVD method, and the stacked layer is selectively etched to have a desired shape (see FIG. 19C).

Next the insulating layers 1522 and 1523 are selectively etched, so that openings 1530a to 1530f reaching the semiconductor layers 1571 to 1574 and openings 1531a to 1531d reaching the conductive layer 1504 to 1507 are formed (see FIG. 19D).

Then, removal of oxide films on exposed surfaces of the semiconductor layers 1571 to 1574 and exposed surfaces of conductive layers 1504 to 1507 and cleaning of the surfaces are performed at the same time using an etchant containing hydrofluoric acid.

Next, a conductive layer covering the insulating layer 1523, the openings 1530a to 1530f, and the openings 1531a to 1531d is formed. In this example, as the conductive layer, a stacked layer of a titanium layer having a thickness of 60 nm, a titanium nitride layer having a thickness of 40 nm, a pure aluminum layer having a thickness of 500 nm, and a titanium layer having a thickness of 100 nm is used.

Next, the conductive layer is selectively etched, so that conductive layers 1540a to 1540d each functioning as a first electrode or a second electrode, conductive layers 1541a to 1541f which serve as connecting wirings, and a conductive layer 1542 which serves as a connecting wiring of an antenna are formed (see FIG. 20A).

Subsequently, an insulating layer 1543 covering the insulating layer 1523, the conductive layers 1540a to 1540d, the conductive layers 1541a to 1541f, and the conductive layer 1542 is formed. In this example, a stacked layer of a silicon nitride oxide layer having a thickness of 200 nm and a polyimide layer having a thickness of 1500 nm is used as the insulating layer 1543. In addition, the insulating layer 1543 is selectively etched, so that an opening 1544 reaching the conductive layer 1542 is formed (see FIG. 20B).

Next, a conductive layer is formed over the insulating layer 1543 and in the opening 1544. In this example, a stacked layer of a titanium layer having a thickness of 100 nm and a pure aluminum layer having a thickness of 1500 nm is used as the conductive layer. Further, the conductive layer is selectively etched, so that an antenna 1550 is formed (see FIG. 20C).

In this manner, a p-channel transistor 1551, an n-channel transistor 1552, a memory element 1553, a capacitor 1554 connected to the memory element 1553 in parallel, a resistor 1555, a capacitor 1556 connected to the resistor 1555 in parallel, and the antenna 1550 can be manufactured over the same substrate.

After that, a semiconductor device in which the transistors and the like are formed is separated from the supporting substrate 1501 along the metal layer 1502.

Further, in the case where a plurality of semiconductor devices are formed over the supporting substrate 1501, one separated sheet is divided into individual semiconductor devices by a cutter, dicing, or the like. Furthermore, if a method by which each semiconductor device is picked up and separated is used, this cutting step is not needed.

Next, the semiconductor device is fixed to a sheet-like substrate. For the sheet-like substrate, plastic, paper, a prepreg, a ceramic sheet, or the like can be used. The semiconductor device may be fixed so as to be interposed between two sheet-like substrates, or the semiconductor device may be fixed to one sheet-like substrate with an adhesive layer. As the adhesive, for example, various curable adhesives such as a reactive curable adhesive, a thermosetting adhesive, and a photo curable adhesive such as an ultraviolet curable adhesive, and an anaerobic adhesive can be used. Alternatively, the semiconductor device can be provided in the middle of making paper, so that the semiconductor device can be provided inside one piece of paper.

Note that the contents or a part of the contents of this embodiment can be combined with any of the contents or a part of the contents of the other embodiments or example as appropriate.

This application is based on Japanese Patent Application serial no. 2009-229869 filed with Japan Patent Office on Oct. 1, 2009, the entire contents of which are hereby incorporated by reference.

What is claimed is:

1. A semiconductor device comprising:
   a memory element including a first conductive layer, a memory layer over the first conductive layer, and a second conductive layer over the memory layer; and
   a resistor including a third conductive layer, a resistive layer over the third conductive layer, which is formed of the same material as the memory layer, and a fourth conductive layer over the resistive layer,
   wherein the memory element is electrically connected to the resistor; and
   wherein the maximum value of a voltage applied to the memory element is higher than the maximum value of a voltage applied to the resistor.

2. The semiconductor device according to claim 1, wherein the first conductive layer and the third conductive layer, or the second conductive layer and the fourth conductive layer are formed of the same material.

3. The semiconductor device according to claim 1, wherein the first conductive layer and the third conductive layer are formed of the same material, and the second conductive layer and the fourth conductive layer are formed of the same materials.

4. A semiconductor device comprising:
   a memory element including a first conductive layer, a memory layer over the first conductive layer, and a second conductive layer over the memory layer; and
   a resistor including a third conductive layer, a resistive layer over the third conductive layer, which is formed of the same material as the memory layer, and a fourth conductive layer over the resistive layer,
   wherein the memory element is electrically connected to the resistor,
   wherein the third conductive layer is a silicon electrode layer,
   wherein the resistive layer is a stacked layer of an amorphous silicon layer over the silicon electrode layer and an insulating layer over the amorphous silicon layer, and
   wherein a contact area between the first conductive layer and the memory layer is larger than a contact area between the third conductive layer and the resistive layer.

5. The semiconductor device according to claim 4, wherein the maximum value of a voltage applied to the memory element is higher than the maximum value of a voltage applied to the resistor.

6. The semiconductor device according to claim 4, wherein the second conductive layer and the fourth conductive layer are formed of the same material.

* * * * *